United States Patent
Yasuda

(10) Patent No.: US 7,989,871 B2
(45) Date of Patent: Aug. 2, 2011

(54) NONVOLATILE SEMICONDUCTOR MEMORY DEVICE HAVING INSULATING FILMS THAT INCLUDE MULTIPLE LAYERS FORMED BY INSULATING MATERIALS HAVING D-ORBITAL METAL ELEMENT AND INSULATING MATERIALS WITHOUT D-ORBITAL METAL ELEMENT

(75) Inventor: Naoki Yasuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 63 days.

(21) Appl. No.: 11/680,945

(22) Filed: Mar. 1, 2007

(65) Prior Publication Data

US 2007/0215929 A1    Sep. 20, 2007

(30) Foreign Application Priority Data

Mar. 15, 2006 (JP) ................................. 2006-071327

(51) Int. Cl.
*H01L 29/788* (2006.01)
(52) U.S. Cl. ...... 257/316; 257/315; 257/317; 257/E29.3; 257/E29.129
(58) Field of Classification Search .......... 257/315–317, 257/347, E29.3, E29.129
See application file for complete search history.

(56) References Cited

U.S. PATENT DOCUMENTS

| 6,914,292 B2 | 7/2005 | Specht et al. | |
| 2005/0151184 A1* | 7/2005 | Lee et al. | 257/314 |
| 2005/0157549 A1* | 7/2005 | Mokhlesi et al. | 365/185.01 |
| 2006/0261401 A1* | 11/2006 | Bhattacharyya | 257/316 |
| 2007/0029602 A1* | 2/2007 | Lin et al. | 257/315 |
| 2007/0045711 A1* | 3/2007 | Bhattacharyya | 257/315 |

FOREIGN PATENT DOCUMENTS

| JP | 10-233505 | 9/1998 |
| JP | 2000-58831 | 2/2000 |
| JP | 2001-308286 | 11/2001 |
| JP | 2003-68897 | 3/2003 |
| JP | 2003-197785 | 7/2003 |
| JP | 2004-281662 | 10/2004 |
| JP | 2006-5006 | 1/2006 |

OTHER PUBLICATIONS

Hideki Takeuchi, et al., "Observation of bulk $HfO_2$ defects by spectroscopic ellipsometry", J. Vac. Sci. Technol. A 22(4), Jul./Aug. 2004, pp. 1337-1341.
Gerald Lucovsky et al., "Chemical bonding and electronic structure of high-k transition metal dielectrics: applications to interfacial band offset energies and electronically active defects", (Chapter 4.2), High-k Gate Dielectrics, Edited by Michael Houssa, Institute of Physics Publishing. 2004, pp. 325-371 and cover page.
U.S. Appl. No. 11/548,914, filed Oct. 12, 2006, Yasuda, et al.

* cited by examiner

*Primary Examiner* — Anh Phung
*Assistant Examiner* — Allison P Bernstein
(74) *Attorney, Agent, or Firm* — Oblon, Spivak, McClelland, Maier & Neustadt, L.L.P.

(57) ABSTRACT

A nonvolatile semiconductor memory device includes a first insulating film on a channel, a floating gate electrode on the first insulating film, a second insulating film on the floating gate electrode, and a control gate electrode on the second insulating film. Each of the first and second insulating films comprises at least two layers, one layer directly in contact with the floating gate electrode is formed by an insulating material (A) including a metal element having a d orbital, and the other at least one layer is formed by an insulating material (B) chiefly including one of a metal element without the d orbital, and a semiconductor element.

8 Claims, 11 Drawing Sheets

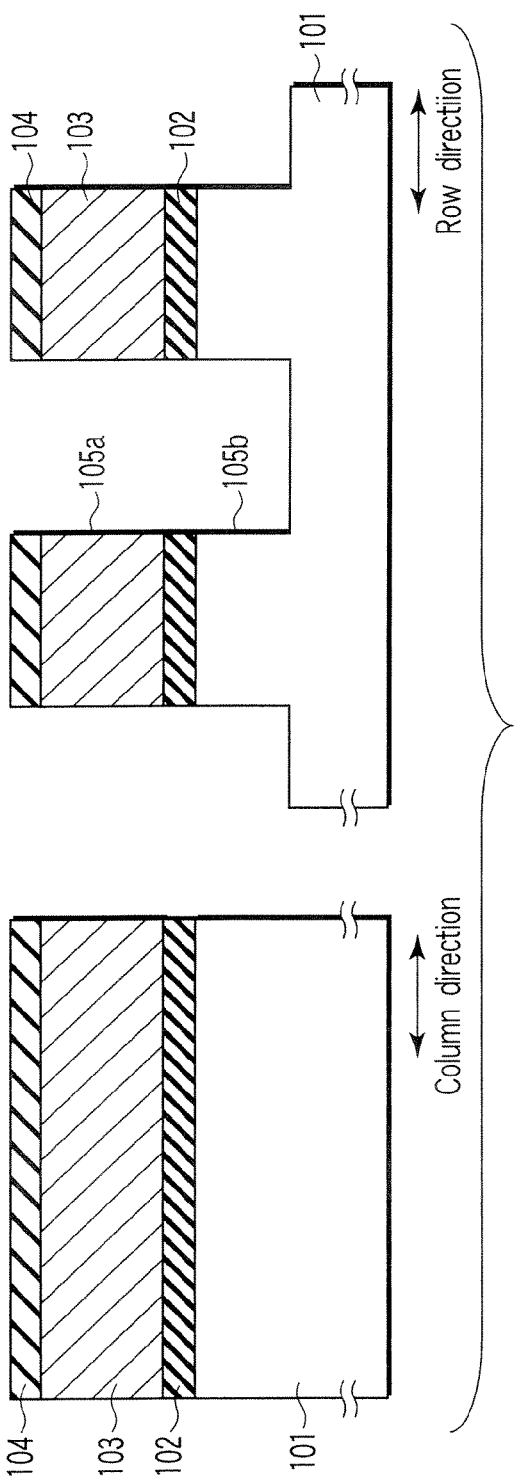
F I G. 2
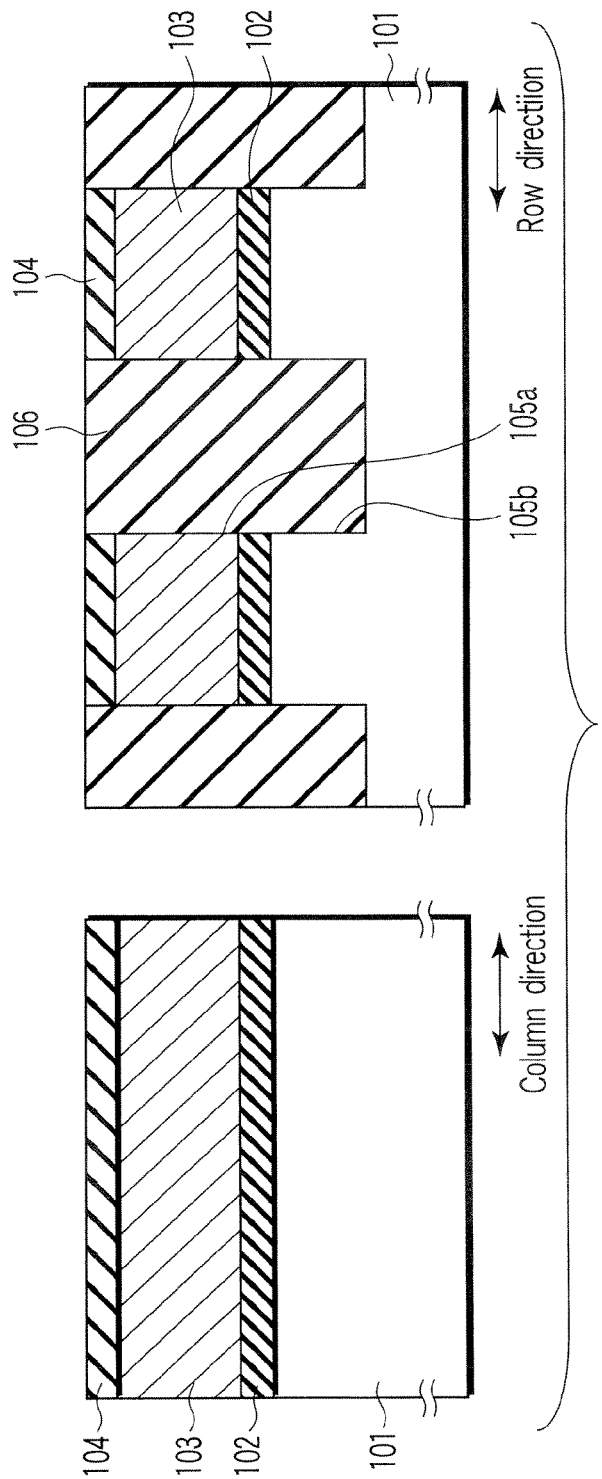
F I G. 3

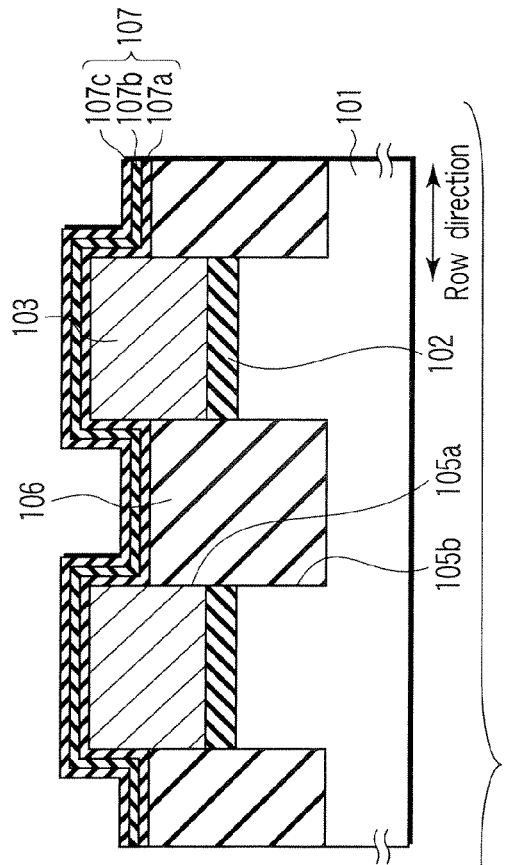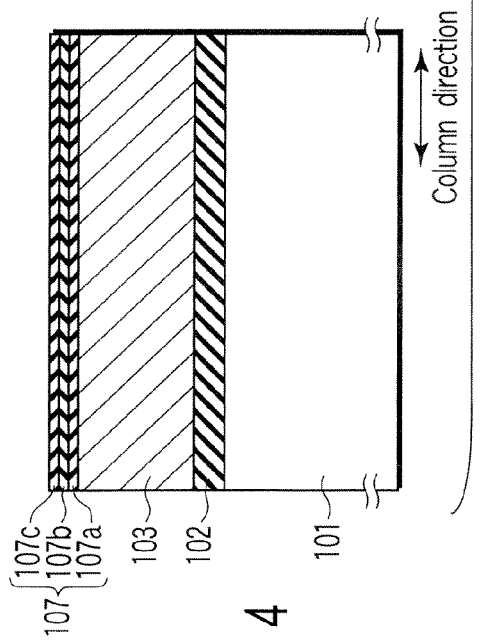
F I G. 4
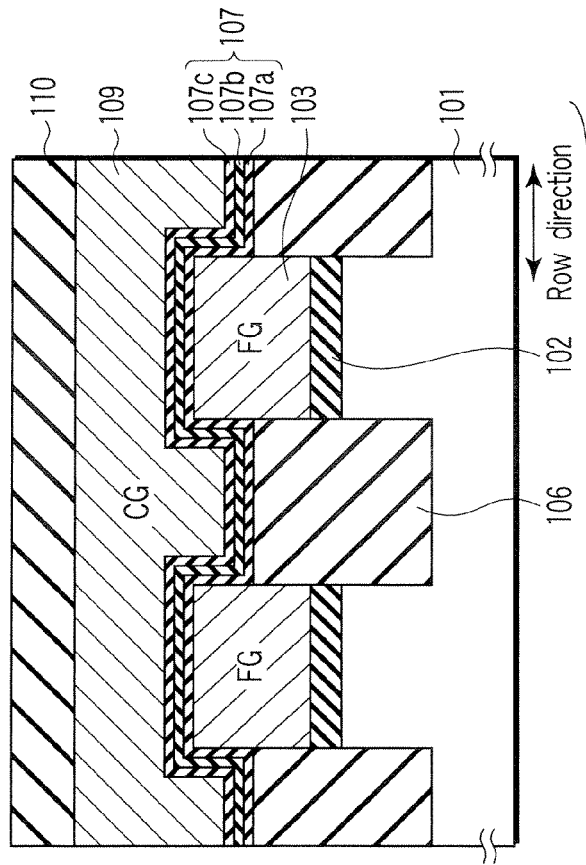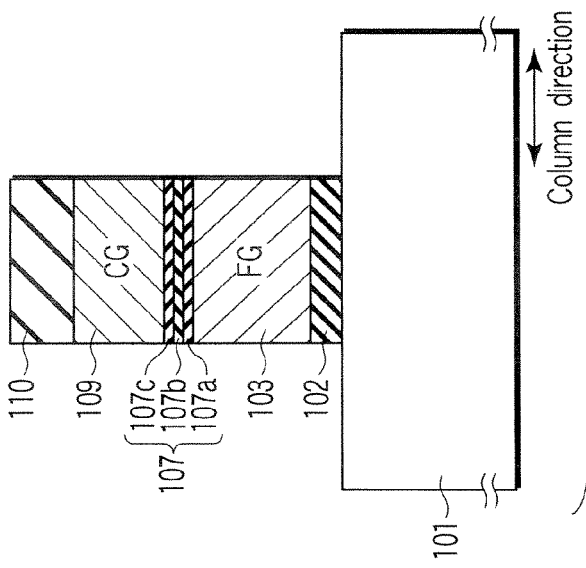
F I G. 5

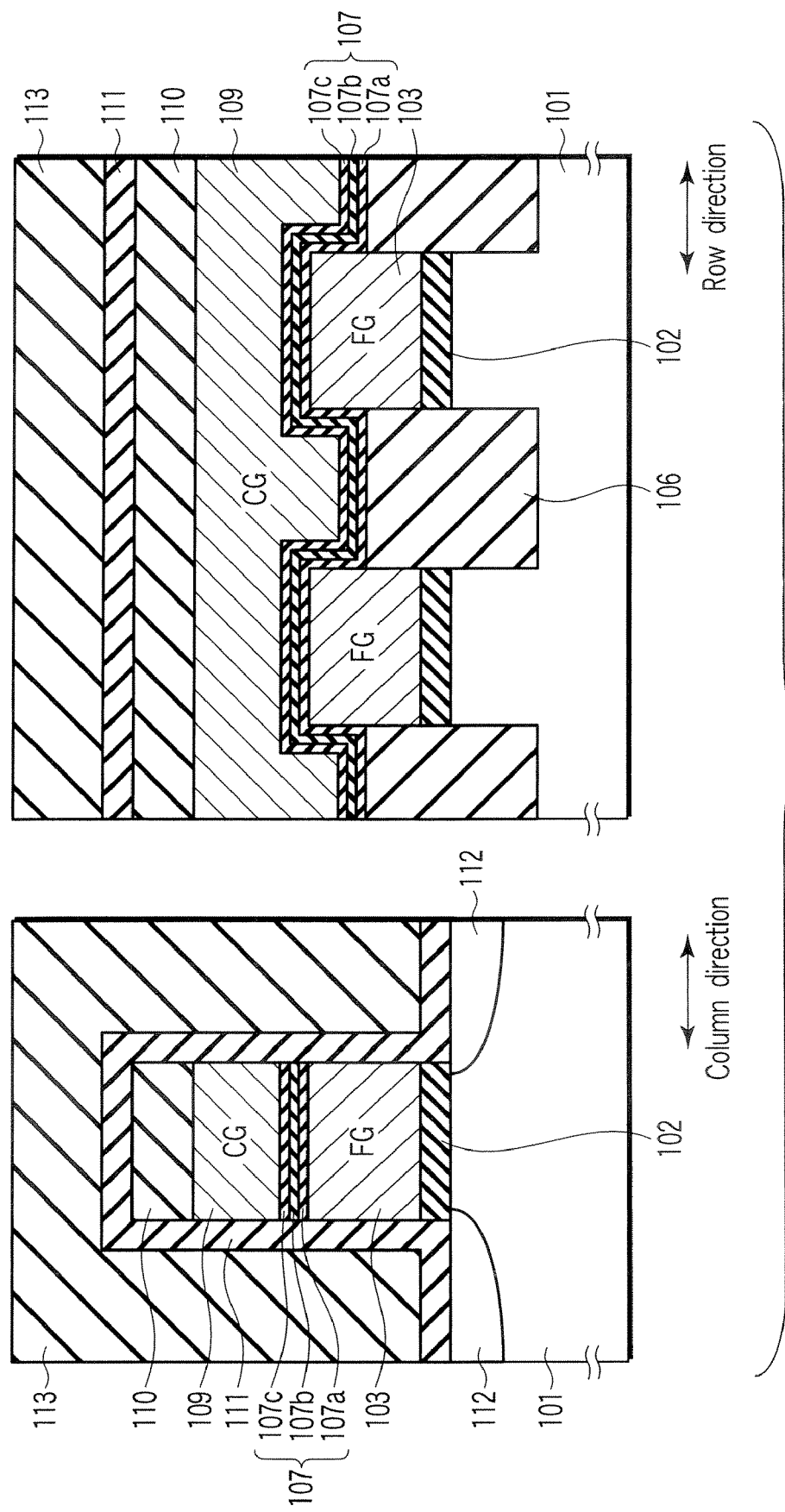
F I G. 6

A: Introducing high-k film between tunnel insulating film T-ox and floating gate electrode FG instead of removing oxide film Ox under high-k film B: Adjusting thickness of oxide film Ox. of IPD film and thickness of tunnel insulating film T-ox, for adjustment of coupling ratio

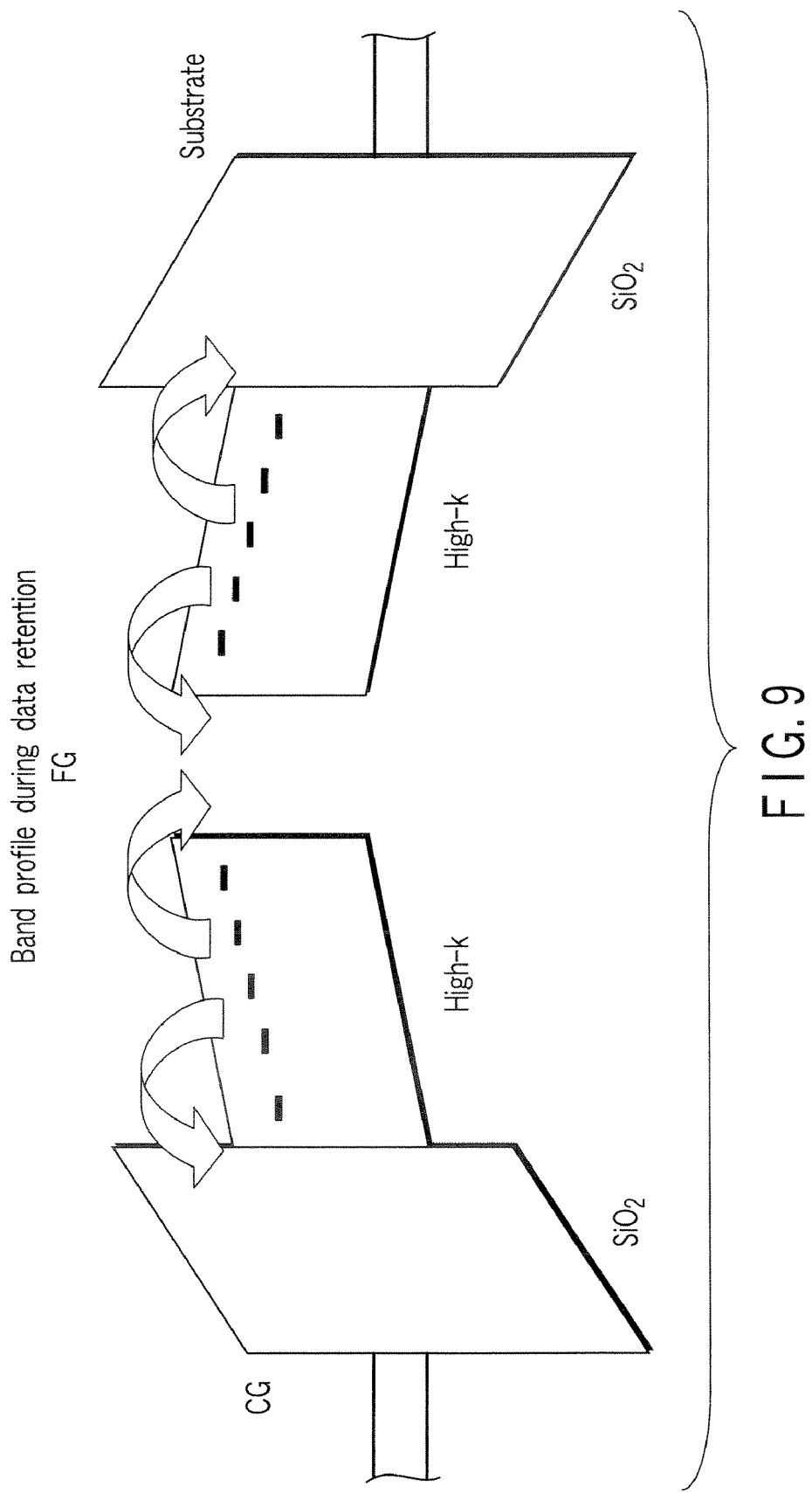
F I G. 9

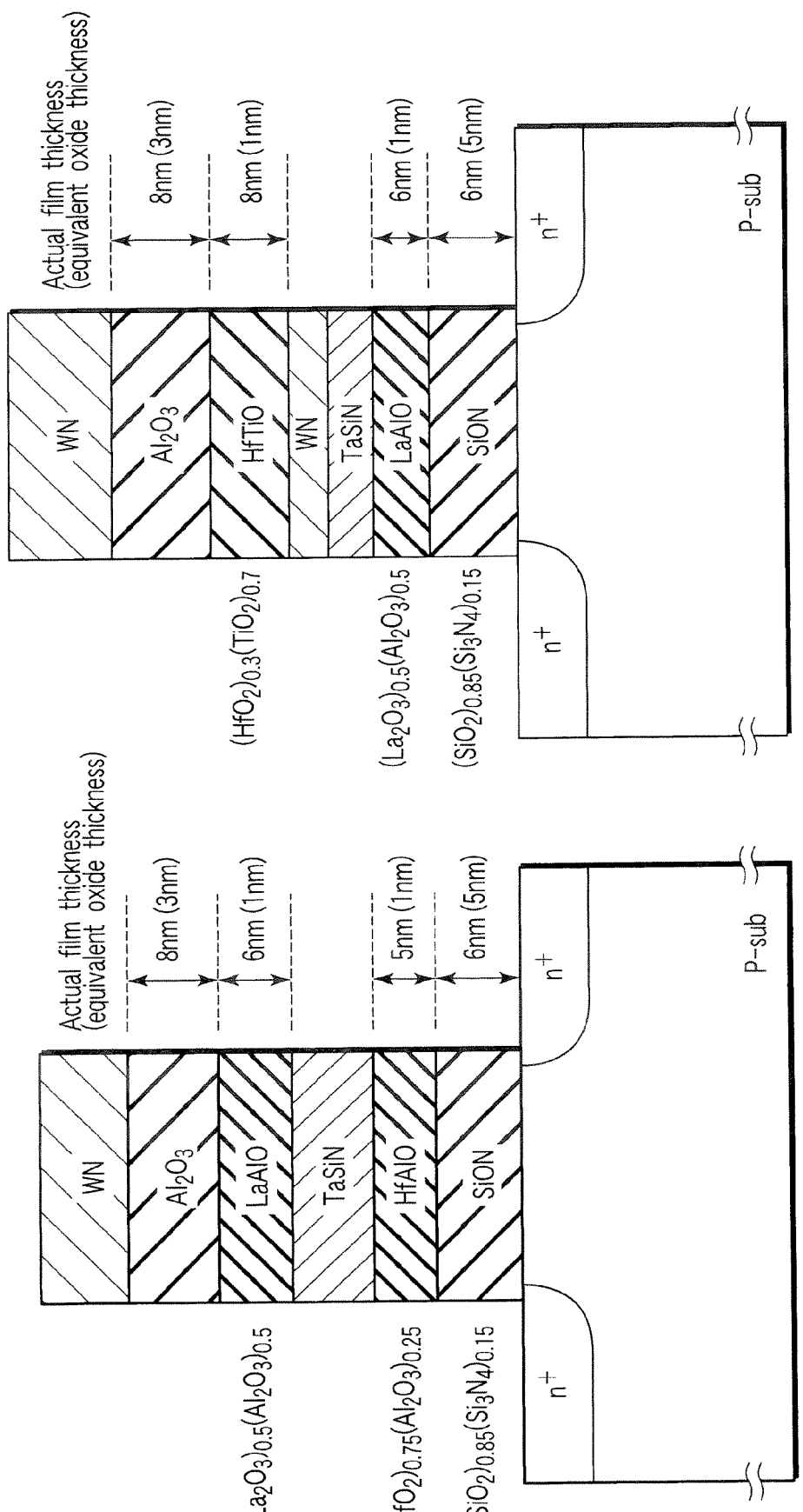

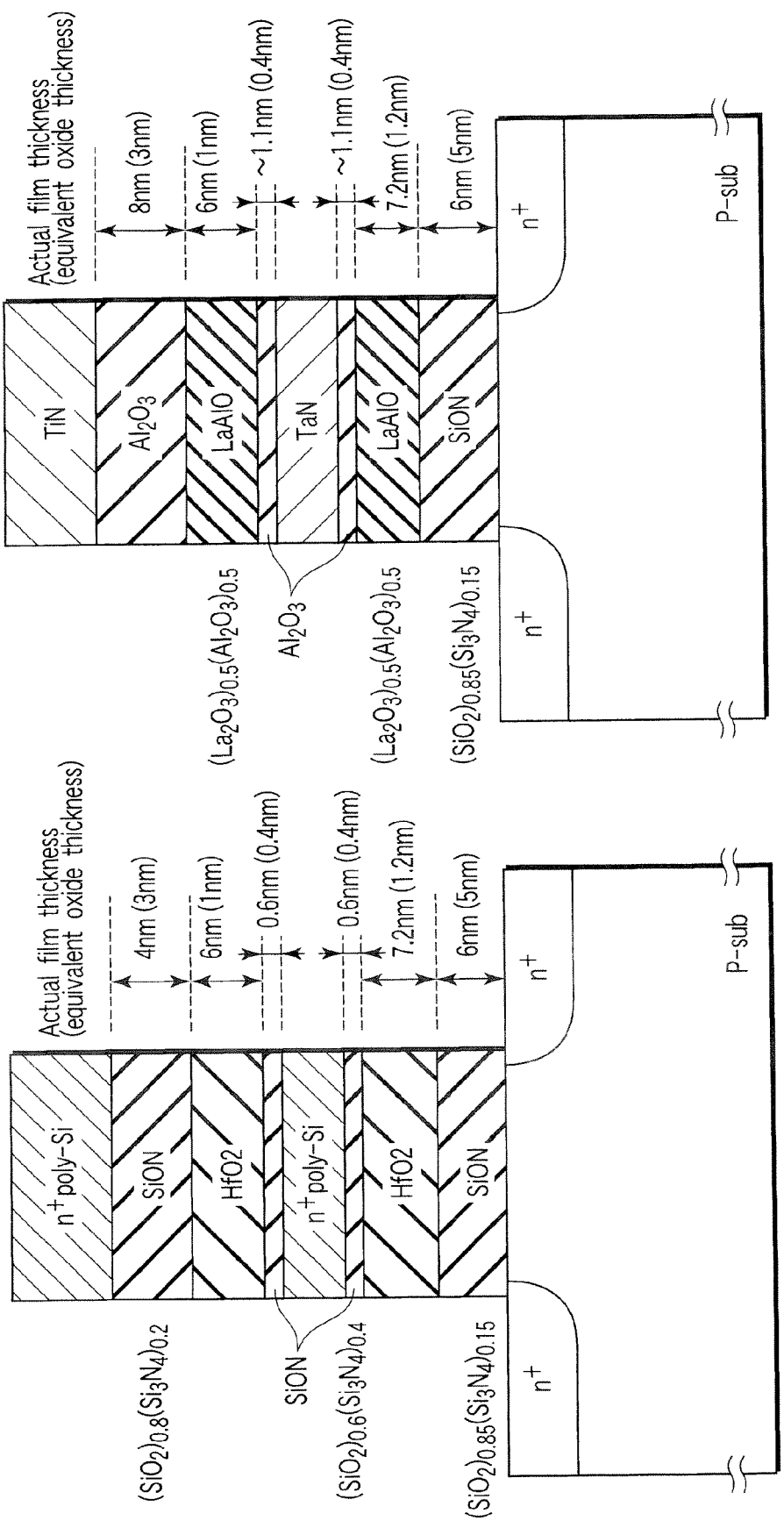

7,989,871 B2

NONVOLATILE SEMICONDUCTOR MEMORY DEVICE HAVING INSULATING FILMS THAT INCLUDE MULTIPLE LAYERS FORMED BY INSULATING MATERIALS HAVING D-ORBITAL METAL ELEMENT AND INSULATING MATERIALS WITHOUT D-ORBITAL METAL ELEMENT

CROSS-REFERENCE TO RELATED APPLICATIONS

This application is based upon and claims the benefit of priority from prior Japanese Patent Application No. 2006-071327, filed Mar. 15, 2006, the entire contents of which are incorporated herein by reference.

BACKGROUND OF THE INVENTION

1. Field of the Invention

The present invention relates to a nonvolatile semiconductor memory device having a memory cell with a stacked gate structure.

2. Description of the Related Art

In the nonvolatile semiconductor memory device such as a NAND type flash memory, each memory cell (cell transistor) has a stacked gate structure.

The stacked gate structure means the structure in which a floating gate electrode and a control gate electrode are stacked on a channel in a source/drain diffusion layer. Between the channel and the floating gate electrode, there exists a first insulating film called "tunnel insulating film". Between the floating gate electrode and the control gate electrode, there exists a second insulating film called "inter-polysilicon dielectric" or "inter-electrode insulating film".

In the conventional technique, a stack insulating film of $SiO_2/Si_3N_4/SiO_2$ called ONO film is mainly used as the second insulating film (for example, refer to JP-A 2003-68897 (KOKAI), 2003-197785 (KOKAI), and 2004-281662 (KOKAI)).

A memory cell in the future, in pursuit of miniaturization for larger memory capacity, needs to further decrease the equivalent oxide thickness of the second insulating film. For this purpose, it is examined that $Si_3N_4$ in the central portion of the ONO film is replaced by the material of higher dielectric constant (high-k material). Namely, $SiO_2$/high-k/$SiO_2$ is proposed to form the second insulating film.

The $Si_3N_4$ or high dielectric constant (high-k) insulating film, however, in the central portion of the ONO film and/or the $SiO_2$/high-k/$SiO_2$ film originally includes a lot of defects. Since the defects of the $Si_3N_4$ film are related with nitrogen concentration, they seem to be caused by nitrogen.

On the other hand, it is known that the defects of the high-k insulating film are mainly caused by those centers having energy levels in a conduction band of the high-k insulating film (for example, refer to H. Takeuchi, D. Ha, and T.-J. King, "Observation of bulk $HfO_2$ defects by spectroscopic ellipsometry," J. Vac. Sci. Technol. A22, 1337 (2004)).

This fact originates from the d-orbital included in a metal element of a high-k insulating film (for example, refer to G. Lucovsky and J. L. Whitten, "Chemical bonding and electronic structure of high-k transition metal dielectrics: applications to interfacial band offset energies and electronically active defects," pp. 325-371 (Chapter 4.2), in High-k Gate Dielectrics, Edited by M. Houssa, IOP Publishing Ltd (2004)).

The ONO film and the $SiO_2$/high-k/$SiO_2$ film can suppress the detrapping of the trapped charges, by the presence of the $SiO_2$ films at both ends of the central defective insulating film hence to secure electrical stability in the stacked gate structure.

As an adverse effect, however, because of the $SiO_2$ films existing on the both ends, the second insulating film cannot help but increase the equivalent oxide thickness, which interferes with its use for a memory cell of the future generations requiring scaling down of the thickness. On the contrary, when the $SiO_2$ films existing on the both ends are removed, the second insulating film can be reduced in the equivalent oxide thickness, but the detrapping of the trapped charges remarkably occurs, resulting in a change in the threshold voltage of the stacked gate structure, hence to deteriorate the data retention characteristic of the memory cell.

BRIEF SUMMARY OF THE INVENTION

A nonvolatile semiconductor memory device according to an aspect of the present invention comprises a first insulating film on a channel, a floating gate electrode on the first insulating film, a second insulating film on the floating gate electrode, and a control gate electrode on the second insulating film. Each of the first and second insulating films comprises at least two layers, one layer directly in contact with the floating gate electrode is formed by an insulating material (A) including a metal element having a d-orbital, and the other at least one layer is formed by an insulating material (B) chiefly including at least one selected from a group of a metal element without the d-orbital, and a semiconductor element.

BRIEF DESCRIPTION OF THE SEVERAL VIEWS OF THE DRAWING

FIG. 2 is a cross-sectional view showing an example of a method of manufacturing a cell structure as a reference;

FIG. 3 is a cross-sectional view showing an example of a method of manufacturing a cell structure as a reference;

FIG. 4 is a cross-sectional view showing an example of a method of manufacturing a cell structure as a reference;

FIG. 5 is a cross-sectional view showing an example of a method of manufacturing a cell structure as a reference;

FIG. 6 is a cross-sectional view showing an example of a method of manufacturing a cell structure as a reference;

FIG. 9 is a cross-sectional view showing a band profile at a time of data retention;

FIG. 15 is a cross-sectional view showing a cell structure according to a fifth embodiment;

FIG. 16 is a cross-sectional view showing a cell structure according to a sixth embodiment;

FIG. 17 is a cross-sectional view showing a cell structure according to a seventh embodiment; and FIG. 18 is a cross-sectional view showing a cell structure according to an eighth embodiment.

DETAILED DESCRIPTION OF THE INVENTION

A nonvolatile semiconductor memory device of an aspect of the present invention will be described below in detail with reference to the accompanying drawing.

1. Reference

Embodiments of the invention are applied to a nonvolatile semiconductor memory device having a memory cell of a stacked gate structure.

This nonvolatile semiconductor memory device is directed to increasing the facing area of a floating gate electrode and a control gate electrode, in order not to deteriorate a coupling ratio even in a miniaturized memory cell.

Figure 1:
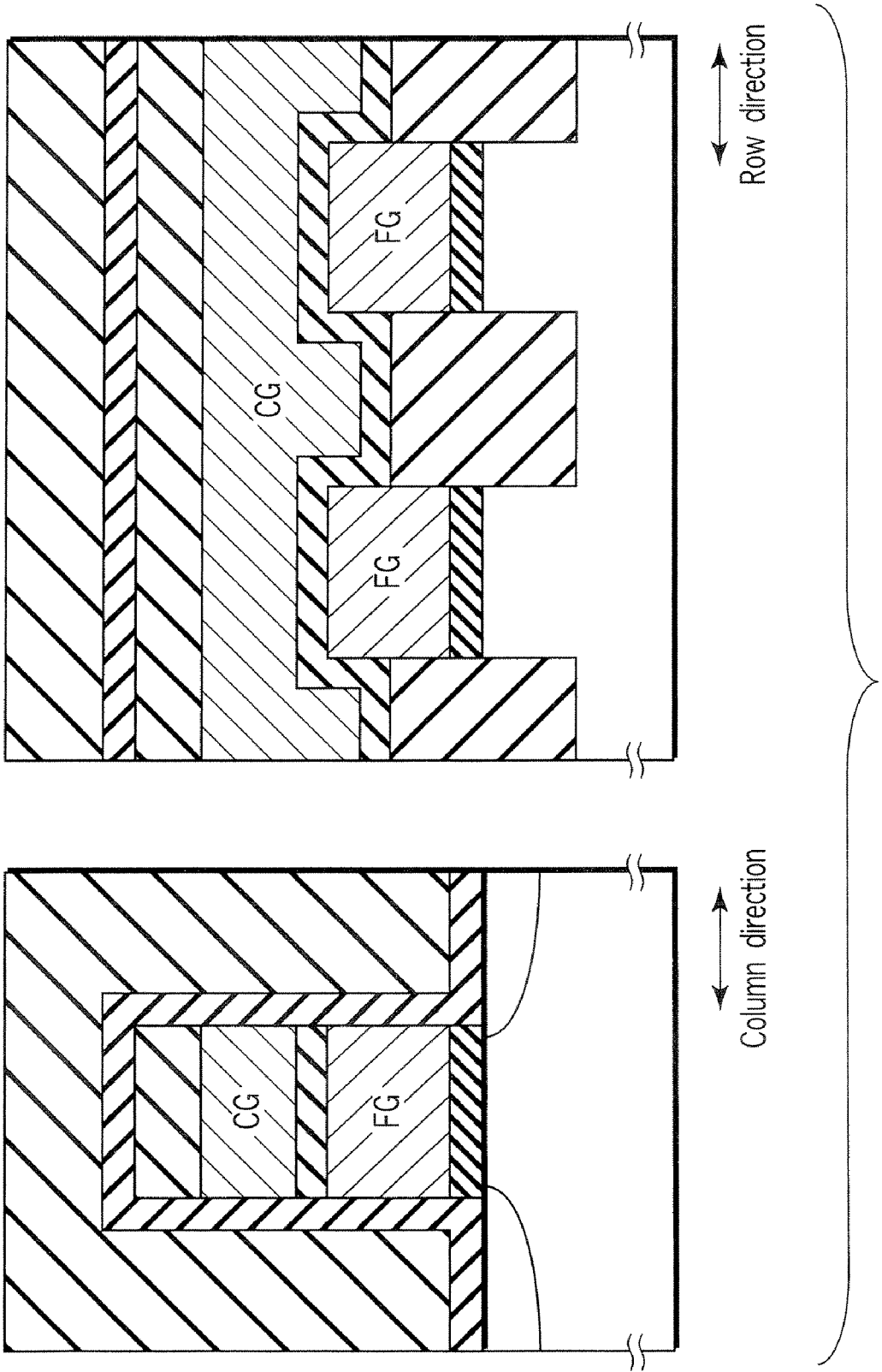
FIG. 1 is a cross-sectional view showing an example of a cell structure as a reference.

FIG. 1 shows an example of such a cell structure.

In the same figure, a row direction indicates a direction of a word line (control gate electrode) extending and a column direction indicates a direction orthogonal to the row direction.

This structure is characterized in that one portion of a vertical surface of a floating gate electrode FG is covered with a control gate electrode CG. This helps increase the area where the floating gate electrode FG and the control gate electrode CG face each other, to increase the coupling ratio of a memory cell.

However, with miniaturization of a memory cell in these days, in order to cope with a larger interference between the adjacent cells in this structure, an $SiO_2$/high-k/$SiO_2$ stack insulating film, in which a higher dielectric constant (high-k) material is used for the center layer of a multi-layered inter-polysilicon dielectric, has been used in order to increase the inter-polysilicon dielectric capacitance more than ever, thereby decreasing the facing area of the electrodes as much as possible, or a method of building up "flat cell structure" without three dimensional facing of the electrodes has been tried.

Hereafter, an inter-electrode insulating film arranged between the floating gate electrode and the control gate electrode is generically referred to as inter-polysilicon dielectric (IPD). This reference is also used in the case where the both electrodes are made of material other than polycrystalline silicon.

FIGS. 2 to 6 respectively show an example of a method of manufacturing the cell structure in FIG. 1 when a higher dielectric constant material is used.

As illustrated in FIG. 2, a tunnel oxide film 102 with thickness of about 7 to 8 nm is formed on an impurity-doped silicon substrate (including wells) 101 through thermal oxidation. A phosphorus-doped polysilicon film 103 with thickness of about 60 nm and a mask 104 for processing an isolation area are sequentially formed on the tunnel oxide film 102 using the chemical vapor deposition (CVD) method.

A photoresist is formed on the mask 104 and this photoresist is exposed and developed. The pattern of the photoresist is transferred to the mask 104 according to the reactive ion etching (RIE) method. Thereafter, the photoresist is removed.

According to the RIE method, the polysilicon film 103 and the tunnel oxide film 102 are sequentially etched with the mask 104 used as masking and a slit 105a for separating the floating gate electrodes of the adjacent memory cells in the row direction is formed.

Continuously, according to the RIE method, the silicon substrate 101 is etched to form an isolation trench 105b about 100 nm deep on the silicon substrate 101.

As illustrated in FIG. 3, a silicon oxide film 106 to completely fill the slit 105a and the isolation trench 105b is formed according to the CVD method. The silicon oxide film 106 is polished according to the chemical mechanical polishing (CMP) method so that the mask 104 can appear, hence to make the surface of the silicon oxide film 106 flat.

Thereafter, the mask 104 is selectively removed.

As illustrated in FIG. 4, the silicon oxide film 106 is etched back using hydrofluoric acid solution and part of the vertical surfaces of the polysilicon film 103 is exposed. This etch back time can be adjusted to selectively form both the "three dimensional cell structure" with part of the vertical surface of the polysilicon film 103 bared and the "flat cell structure" without the above.

Further, according to the atomic layer deposition (ALD) method, an IPD film 107 is formed as a stack film consisting of a 4 nm thick silicon oxide film 107a covering the top surface and part of the vertical surface of the polysilicon film 103, a 6 nm thick alumina film 107b, and a 4 nm thick silicon oxide film 107c.

Here, the silicon oxide films 107a and 107c may be formed by the usual CVD method.

As illustrated in FIG. 5, according to the CVD method, a conductive film 109 with thickness of about 100 nm in total including two layers of, for example, a polysilicon film and a tungsten silicide film is formed on the IPD film 107. Continuously, a mask 110 is formed on the conductive film 109 according to the CVD method.

Thereafter, a photoresist is formed on the mask 110 and this photoresist is exposed and developed. According to the RIE method, the pattern of the photoresist is transferred to the mask 110. Then, the photoresist is removed.

The conductive film 109, the IPD film 107, the polysilicon film 103, and the tunnel oxide film 102 are sequentially etched with the mask 110 used as masking, according to the RIE method, hence to form a floating gate electrode FG and a control gate electrode CG.

As illustrated in FIG. 6, after a silicon oxide film 111 is formed on the surface of the floating gate electrode FG and the control gate electrode CG through the thermal oxidation, a source/drain diffusion layer 112 is formed on the surface of the silicon substrate 101 according to the ion implantation method by self alignment, and a memory cell is completed.

At last, an inter-layer insulating film 113 which covers the memory cell is formed according to the CVD method.

Thus formed memory cell can be miniaturized to some extent while keeping the coupling ratio by adjusting the three-dimensional facing area of the electrodes. In the further miniaturized generation with gate length of 30 nm and beyond, however, it will be difficult to embed the IPD film, and since the interference between the adjacent cells becomes larger, it is supposed that not only the conventional ONO film, but also the $SiO_2$/high-k/$SiO_2$ structure cannot cope with these generations.

Therefore, further down-scaling in the equivalent oxide thickness of the IPD film is required in order to change a memory cell from a three dimension structure to a flat structure. The IPD film with the high-k insulating film and adjacent $SiO_2$ films at both ends has a limit to down-scaling in the equivalent oxide thickness, because of the existence of the thick $SiO_2$ films, so that it cannot cope with the generation with gate length of 30 nm and beyond.

2. Outline of the Invention

Figure 7:
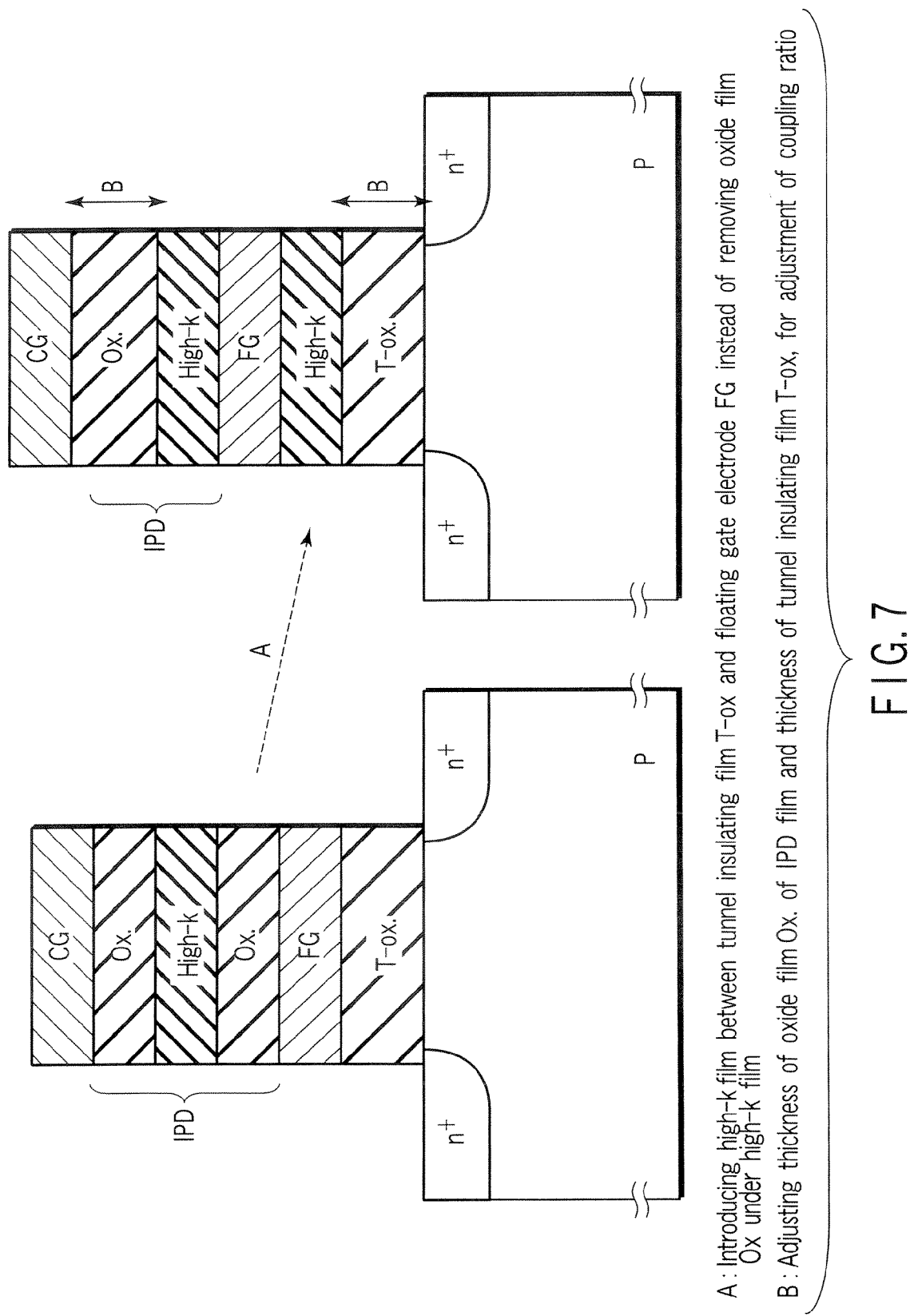
FIG. 7 is a cross-sectional view showing the concept of the invention.

The concept of the invention will be described using FIG. 7.

The conventional IPD film decreases the charge trapping/detrapping by the comparatively thick $SiO_2$ films existing on its both sides whether it is the ONO film or its center $Si_3N_4$ film is replaced by the high-k insulating film.

Especially, in the duration of data retention after programming of a memory cell, the insulating property of the $SiO_2$ films is so high that the charges trapped by the $Si_3N_4$ film or the high-k insulating film in the duration of programming are never detrapped again. The retention characteristic in the stacked gate structure is thus favorable.

On the contrary, the invention adopts the gate stack structure in which each of the tunnel insulating film and the IPD film is formed by at least two layers. One layer is directly in contact with the floating gate electrode and formed by an insulating material (A) including a metal element having a d-orbital. The other at least one layer is formed by an insulating material (B) chiefly including one of a metal element without the d-orbital, and a semiconductor element.

This structure is characterized in that no $SiO_2$ layer exists in the IPD film on the side of the floating gate electrode. In this case, the charge detrapping from the IPD film to the control gate electrode is suppressed to the same degree just as in the conventional technique, while the charge detrapping from the IPD film into the floating gate electrode remarkably occurs because there is no $SiO_2$ film serving as a barrier layer.

However, since the charge detrapping in almost the same amount as the above occurs from the high-k film of the tunnel insulating film to the floating gate electrode, the both currents cancel a change in the threshold voltage and as a result, apparently there is no shift in the threshold voltage on the whole stacked gate structure of the flash memory cell.

Namely, in the conventional technique, the $SiO_2$ films are required on the both sides of the center layer in the IPD film, while in the invention, the $SiO_2$ film is necessary only on the side of the control gate electrode whereas the $SiO_2$ film existing on the side of the floating gate electrode in the IPD film is not necessary. This $SiO_2$ film is about 3 to 4 nm thick. When it becomes unnecessary, the equivalent oxide thickness of the IPD film can be significantly reduced and a satisfactory data retention characteristic can be realized.

In the invention, although the high-k insulating film is introduced into the tunnel insulating film, the $SiO_2$ or SiON of the tunnel insulating film is decreased in thickness by amount of the equivalent oxide thickness of the high-k film, hence to form the tunnel insulating film as a stack film of $SiO_2$/high-k or SiON/high-k, with no problem on reliability. This is because this stack film is thicker than the conventional $SiO_2$ or SiON single layered film in the physical film thickness, which reduces the formation of a current leakage path.

In the invention, in order to further suppress the charge detrapping from the IPD film, the control gate electrode and the floating gate electrode may be formed by metal material instead of the conventional polycrystalline silicon.

This is because it has been proved that the charge trapping can be suppressed by using metal for the gate electrode, in the case of a logic CMOS (E. P. Gusev, V. Narayanan, S. Zafar, C. Cabral Jr., E. Cartier, N. Bojarczuk, A. Callegari, R. Carruhers, M. Chudzik, C. D'Emic, E. Duch, P. Jamison, P. Kozlowski, D. LaTulipe, K. Maitra, F. R. McFeely, J. Newbury, V. Paruchuri, and M. Steen, "Charge Trapping in Aggressively Scaled Metal Gate/High-k Stacks," IEDM Tech. Dig. p. 729 (2004)), and it is expected that the same principle can also be applied to the memory cell technology.

Generally, since the charge detrapping amount from the insulating film is related to the trapped charge amount, a decrease of the trapped charge by using metal for the gate electrode is effective in improving not only the characteristic of program/erase but also that of data retention in the stacked gate structure. As concrete metal materials, metallic compound including W, Ti, Ta, Ru, Ni, Co, or alloy thereof, or metal or alloy nitride, silicide, nitride silicide, and carbide is used.

The layer of the high dielectric constant (high-k) insulating material including a metal element having the d-orbital, which is used for the IPD film and the tunnel insulating film, is formed by oxide, nitride, oxynitride, silicate, silicate nitride, aluminate, or aluminate nitride, or their mixture or stacked material, which includes at least one element selected from the group consisting of Hf, La, Y, Ce, Ti, and Zr.

The shape of a floating gate electrode and control gate electrode in a memory cell is not restricted to that in the embodiments of the invention.

For example, a floating gate electrode may be protruded from an isolation insulating layer (STI), and a control gate electrode may be designed to cover a portion of the vertical surface of the floating gate electrode. The edge portion of a floating gate electrode may be formed into a gull wing shape to cover the isolation insulating layer (STI). Alternatively, a flat cell structure may be adopted, in which the top surface of the floating gate electrode is substantially at the same level as the top surface of the isolation insulating layer (STI).

As illustrated in FIG. 1, since the cross sectional shape of a memory cell in the column direction is unchanged, the embodiments of the invention will be hereinafter described by using the cross section in the column direction.

3. Principle of the Invention

The principle of the invention will be described.

Figure 8:
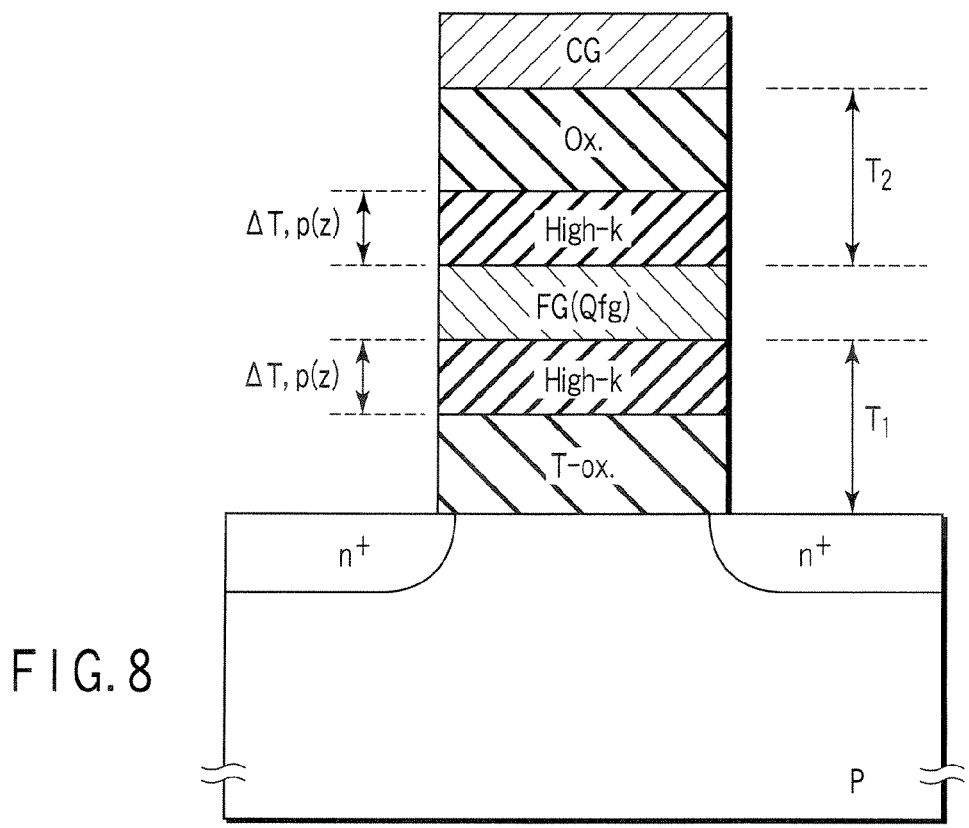
FIG. 8 is a cross-sectional view for describing the principle of the invention according to the mathematical expression.

Generally, the threshold voltage of the memory cell/gate stack is determined by the charge amount existing in the gate stack and its distribution. This will be described according to the memory cell/stacked gate structure illustrated in FIG. 8.

The threshold voltage of this stacked gate structure is represented by the expression (1).

$$V_{th} = V_{th,neutral} - \left( \int_{T_2 - \Delta T}^{T_2} \rho(z')dz' + Q_{fg}T_2 + \int_{T_2}^{T_2 + \Delta T} \rho(z')dz' \right) / \varepsilon_{SiO2} \quad (1)$$

Where, $V_{th,neutral}$ indicates a neutral threshold voltage when the floating gate electrode and the insulating film have no charge, and z indicates an electrically equivalent distance from the control gate electrode. The equivalent oxide thickness of the IPD insulating film is $T_2$ and the equivalent oxide thickness of the tunnel insulating film is $T_1$. Because the floating gate electrode is conductive, the charge in the floating gate electrode is positioned at the equivalent distance $T_2$ from the control gate electrode.

In the expression (1), $\rho(z)$ indicates the charge distribution of each insulating film (distribution in the equivalent distance), $Q_{fg}$ indicates the charge density per unit area of the floating gate electrode, $\Delta T$ indicates the equivalent oxide thickness of each high-k insulating film, and $\varepsilon_{SiO2}$ indicates the dielectric constant of $SiO_2$.

Here, the band profile (potential distribution) of the memory-cell gate stack during date retention is schematically illustrated in FIG. 9.

Since the floating gate electrode accumulates the charge, the potential is higher there. On the contrary, the potential is zero in the control gate electrode and the channel region (substrate). Namely, electric fields are applied in the IPD film and the tunnel insulating film, according to the self potential of the floating gate electrode, and the respective electric fields are in the opposite direction, that is, almost symmetrically. As a result, the detrapping rate from the tunnel insulating film is nearly equal to that from the IPD film.

As a result of the detrapping from the respective high-k insulating films of the tunnel insulating film and the IPD film to the floating gate electrode, the first term of the right side numerator of the expression (1) decreases, the second term thereof increases, and the third term thereof decreases.

As illustrated in FIG. 9, since the $SiO_2$ film exists in the outside of the high-k insulating film when viewed from the floating gate electrode, the charge detrapping does not occur towards the control gate electrode and the Si substrate (neither toward the tunnel insulating film).

Namely, in the stacked gate structure according to the invention, since the charge detrapping occurs only into the floating gate electrode, the amount of stored charge in the whole memory-cell stacked gate structure does not change during date retention.

Accordingly, the threshold voltage does not change unless the position of the charge centroid changes in the whole stacked gate structure.

The fact that the threshold voltage shift during the data retention is suppressed in the stacked gate structure according to the invention can be quantitatively indicated as follows.

Assuming that the charge detrapping from the high-k insulating film occurs uniformly, when the area density of the charge detrapped after a predetermined time is $Q_2$ for the high-k material in the IPD film and $Q_1$ for the high-k material in the tunnel insulating film, a change in each term of the right side numerator of the expression (1), caused by the detrapping, is expressed as follows.

(change in the first term of the right side numerator)=
$-Q_2\{T_2-(\Delta T/2)\}$ (2)

(change in the second term of the right side numerator)=
$(Q_1+Q_2)T_2$ (3)

(change in the third term of the right side numerator)=
$-Q_1\{T_2-(\Delta T/2)\}$ (4)

The change in the threshold voltage is expressed as follows according to the expressions (2), (3), and (4).

$\Delta V_{th} = -(Q_2-Q_1)\cdot(\Delta T/2)$ (5)

Consequently, if the detrapping amount $Q_2$ from the high-k region of the IPD film is equal to the detrapping amount $Q_1$ from the high-k region of the tunnel insulating film, a shift in the threshold voltage during the data retention represented by the expression (5) is zero. Namely, although the detrapping from the high-k film occurs in the stacked gate structure, the threshold voltage does not change from the external viewpoint and the data retention characteristic is maintained satisfactorily.

There are some possibilities as for the relationship between the detrapping amounts $Q_1$ and $Q_2$. Generally, when the high-k insulating films of the same material with the same thickness are positioned on and under the floating gate electrode, $Q_1=Q_2$ is satisfied in most cases.

However, there is a possibility that $Q_1$ is not equal to $Q_2$. In this case, $Q_1=Q_2$ can be realized by properly adjusting the film thickness of each high-k layer. This is because the charge trapping/detrapping amount of the high-k insulating film is generally in proportion to the thickness of the high-k insulating film.

As a main factor of deciding the relationship between $Q_1$ and $Q_2$, the following two factors should be considered.

As one factor, since the detrapping amount from the high-k layer of the IPD film is related to the amount of trapped charge during programming, the trapped charge amount and the charge detrapping amount ($Q_1$) of the high-k layer can be larger in the tunnel insulating film which receives a larger current flow during a programming operation (possibility of $Q_1>Q_2$).

The other factor is a difference in the electric fields of the respective high-k insulating films during the data retention. As illustrated in FIG. 9, the voltage between the floating gate electrode and the control gate electrode is equal to the voltage between the floating gate electrode and the channel (substrate). When this voltage is defined as V, the equivalent electric field ($SiO_2$ equivalent) for the IPD film is $E_2=V/T_2$ (6)

The equivalent electric field for the tunnel insulating film is $E_1=V/T_1$ (7)

Since the coupling ratio is usually about 0.6, in the case of the flat cell structure, $T_1:T_2=3:2$ is realized and during the data retention, the equivalent electric field $E_2$ for the IPD film is a little larger. Though the detrapping from the high-k insulating film does not show much dependence on the electric field, a large electric field in the IPD film may promote the charge detrapping from the high-k insulating layer of the IPD film (possibility of $Q_1<Q_2$).

As mentioned above, a situation in which $Q_1$ is not equal to $Q_2$ is possible. Since the quantitative $Q_1/Q_2$ ratio is determined according to the memory cell structure, the manufacturing method, and the operation condition, it is possible to make $Q_1$ equal to $Q_2$ according to the adjustment of the high-k insulating films based on the fabrication of a testing sample and its result.

The easiest adjustment method is to finely adjust the film thickness of the each high-k film. Further, there is a method of adjusting the thickness of an interfacial layer between the high-k film and the floating gate electrode. Further more, there is a method of controlling the defect density by adjusting the conditions of the post deposition annealing for the high-k layers existing on and under the floating gate electrode.

At last, complementary issues about the film thickness and material of each layer will be described.

It is preferable that the insulating material, of the IPD film, including the metal element or semiconductor element which does not have the d-orbital as a main component, has the film thickness enough to prevent the detrapping into the control gate electrode.

Figure 10:
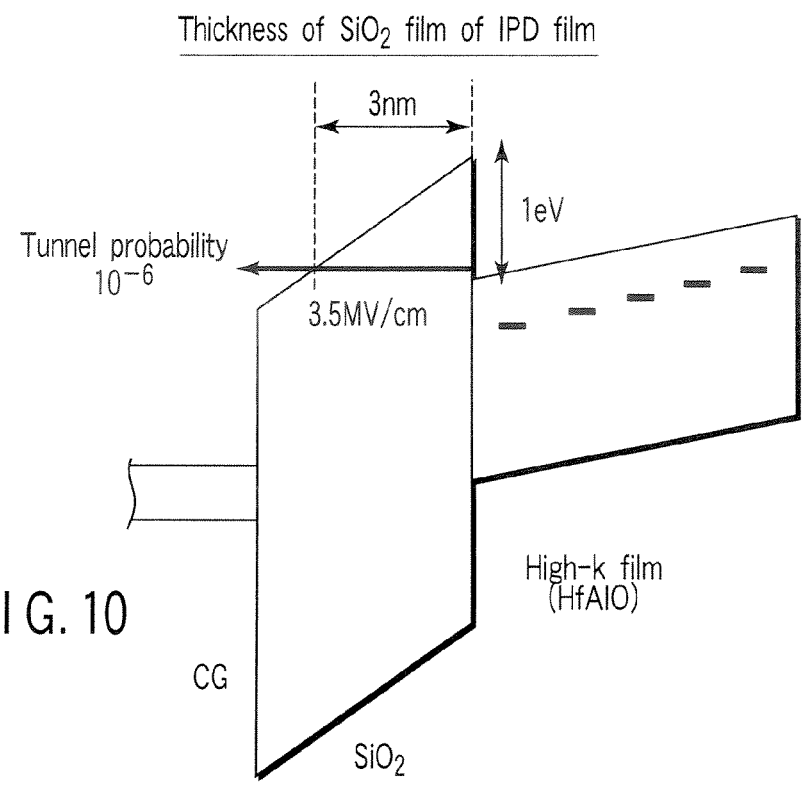
FIG. 10 is an explanatory view for estimating the film thickness necessary for a $SiO_2$ layer of the IPD film.

As a typical example, with respect to the silicon oxide ($SiO_2$) film, when hafnium aluminate $((HfO_2)_{0.75}(Al_2O_3)_{0.25})$ is used for the insulating film material, of the IPD film, including the metal element having the d-orbital, the barrier height of the conduction band between the high-k film and the $SiO_2$ is 1.0 eV, as illustrated in FIG. 10.

Considering that the self electric field due to the floating gate electrode just after programming is about 3.5 MV/cm, the thickness of the silicon oxide ($SiO_2$) should be set at 3 nm or more because Fowler-Nordheim tunneling current occurs for this thickness range.

In this case, in the calculation by the WKB approximation, the probability of the tunneling that the current passes through the $SiO_2$ film from the conduction band of the high-k insulating film is about $10^{-6}$ and the detrapping from the IPD film to the control gate electrode can be suppressed effectively.

When there is an interfacial layer between the insulating material, of the IPD film, including a metal element having the d-orbital and the floating gate electrode, the film thickness of the interfacial layer is set to be smaller than the film thickness of the other layer of the IPD film (insulating material including the metal element or semiconductor element without the d-orbital as a main component), which is in contact with the control gate electrode.

In this manner, the detrapping from the IPD film mainly occurs toward the floating gate electrode. It is the same as for the tunnel insulating film.

Namely, when there is an interfacial layer between the insulating material, of the tunnel insulating film, including the metal element having the d-orbital and the floating gate electrode, the film thickness of the interfacial layer is set to be smaller than the film thickness of the other layer of the tunnel insulating film (the insulating material including the metal element without the d-orbital or semiconductor element as a main component), which is in contact with the channel region (Si substrate).

According to this, the detrapping from the tunnel insulating film mainly occurs toward the floating gate electrode.

The film thickness ratio of the floating gate interfacial layer on the tunnel insulating film side and the IPD film side should be as close to unity as much as possible. This is because $Q_1$ becomes equal to $Q_2$ by aligning a decreasing factor in the detrapping rate in each interfacial layer.

At last, relation between the high-k layer (including the d-orbital metal element) and the other layer (usually, $SiO_2$ or SiON) of the tunnel insulating film will be described.

The tunnel insulating film performs program and erase operations through the Fowler-Nordheim tunneling process with a high electric field imposed on the $SiO_2$ or SiON region.

Therefore, consideration must be taken in order to impose a necessary voltage on this region. The minimum requirement is that the equivalent oxide thickness in the $SiO_2$ or SiON region is larger than the equivalent oxide thickness in the high-k region. The film structure according to the embodiments of the invention is designed to satisfy at least this requirement.

Polycrystalline silicon, metal, and its nitride, carbide, silicide or nitride silicide, or their mixture or stack can be used as materials to form the floating gate electrode and the control gate electrode. Besides, the floating gate electrode may be formed by the material chiefly including Si, for example, SiGe, or the material chiefly including Ge.

Since it is known that an interfacial layer of the high-k insulating film is difficult to form on the material including Ge, the IPD film can be made thinner while suppressing the interfacial layer.

The floating gate electrode may be formed by conductive materials consisting of at least two layers, which are different between the side in contact with the tunnel insulating film and the side in contact with the IPD film.

When the work function of the floating gate on the side of the IPD film is set large and the work function on the side of the tunnel insulating film is set to be nearly equal to that of the $n^+$ type polycrystalline silicon, program/erase operations can be efficiently performed and the leakage current of the IPD film can be decreased. When the control gate electrode is designed in that the interface on the side of the IPD film is formed by a material having a large work function and that a low resistivity material is arranged thereon, it is possible to decrease both the leakage current and the parasitic resistance in the IPD film.

4. Embodiments

According to the principle of the invention, embodiments of the invention will be described in details.

(1) First Embodiment

Figure 11:
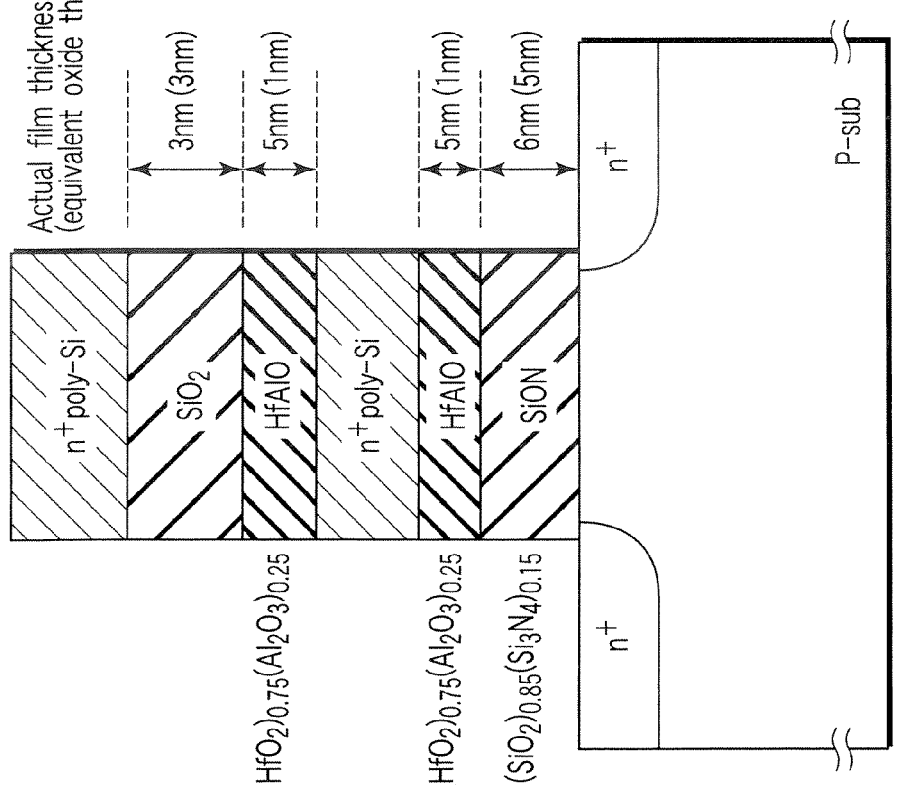
FIG. 11 is a cross-sectional view showing a cell structure according to a first embodiment.

FIG. 11 shows the structure of a memory cell according to a first embodiment.

A two-layered insulating film is formed on a p-type silicon substrate (p-sub) as a tunnel insulating film. A silicon oxynitride film (SION) is formed on the silicon substrate in contact with the channel region thereof. Hafnium aluminate (HfAlO) is formed on the silicon oxynitride film as an insulating material including a metal element having the d-orbital.

Polycrystalline silicon ($n^+$ poly-Si) including n-type dopant impurity (phosphorus) is formed on the two-layered tunnel insulating film as the floating gate electrode. A two-layered insulating film is formed on the polycrystalline silicon as the IPD insulating film. Namely, hafnium aluminate (HfAlO) is formed on the floating gate electrode in contact therewith, as the insulating material including the metal element having the d-orbital.

A silicon oxide film ($SiO_2$) is formed on the hafnium aluminate. Polycrystalline silicon ($n^+$ poly-Si) including the n-type dopant impurity (phosphorus) is formed on the silicon oxide film as the control gate electrode.

Of the tunnel insulating film, when the composition of the SiON is, for example, $(SiO_2)_{0.85}(Si_3N_4)_{0.15}$, the film thickness is set at about 6 nm, and when the composition of the HfAlO is, for example, $(HfO_2)_{0.75}(Al_2O_3)_{0.25}$, the film thickness is set at about 5 nm. Of the IPD film, when the composition of the HfAlO is, for example, $(HfO_2)_{0.75}(Al_2O_3)_{0.25}$, the film thickness is set at about 5 nm and the film thickness of the $SiO_2$ is set at, for example, about 3 nm.

The thickness of the $n^+$ type polycrystalline silicon each serving as the floating gate electrode and the control gate electrode is set at a value in the range of about 30 to 60 nm.

Although in this embodiment, hafnium aluminate is used as the insulating material including the metal element having the d-orbital, its composition is not restricted to that of the embodiment but it may be, for example, in the range of $(HfO_2)_{0.5}(Al_2O_3)_{0.5}$ to $(HfO_2)_{0.9}(Al_2O_3)_{0.1}$, hence to get a favorable leakage current characteristic and material processability. Further, ultra-thin interfacial layers made from insulating material may exist respectively in an interface between the tunnel insulating film and the floating gate electrode and an interface between the IPD film and the floating gate electrode.

In the case of this structure, since the equivalent oxide thickness of the tunnel insulating film becomes 6 nm and the equivalent oxide thickness of the IPD film becomes 4 nm, the height of a floating gate electrode 103 can be aligned to the height of a isolation oxide film 106, in FIG. 6, to realize a so-called flat memory cell structure.

Basically, the process which has been described in the reference (FIGS. 1 to 6) can be applied to the method of manufacturing the memory cell in FIG. 11, without any modification.

Hereafter, only the steps different from those of the reference will be described.

The oxynitride film of the tunnel insulating film is formed by the plasma nitridation after the silicon oxide film is formed as a base. Next, the hafnium aluminate (HfAlO) is formed, for example, in the atmosphere at a temperature of about 250° C. by the ALD method with the source gas of $Al(CH_3)_3$, Hf[N $(CH_3)_2]_4$ and $H_2O$. Then, it is annealed in an $O_2$ ambient at a temperature of about 850° C. and a pressure of about 130 Pa.

The hafnium aluminate of the IPD film can be formed in the same way as that of the tunnel insulating film. Then, the $SiO_2$ film is formed according to the plasma CVD method with $SiH_4$ and $N_2O$.

The manufacturing method shown here is only one example and another manufacturing method may be used in order to form the memory cell of FIG. 11.

For example, another gas may be used with respect to the source gas used for the ALD method and the $SiO_2$ film of the IPD film may be formed by the thermal CVD method with TEOS-$O_2$ or the ALD method with $SiH_4$ and $H_2O$, instead of the plasma CVD method.

Alternatively, it is possible to form the high-k insulating films and the SiON/$SiO_2$ films included in the tunnel insulating film and the IPD film, according to the sputtering, vapor deposition, laser ablation, MBE method, or a method of these combination, other than the ALD and CVD methods.

(2) Second Embodiment

Figure 12:
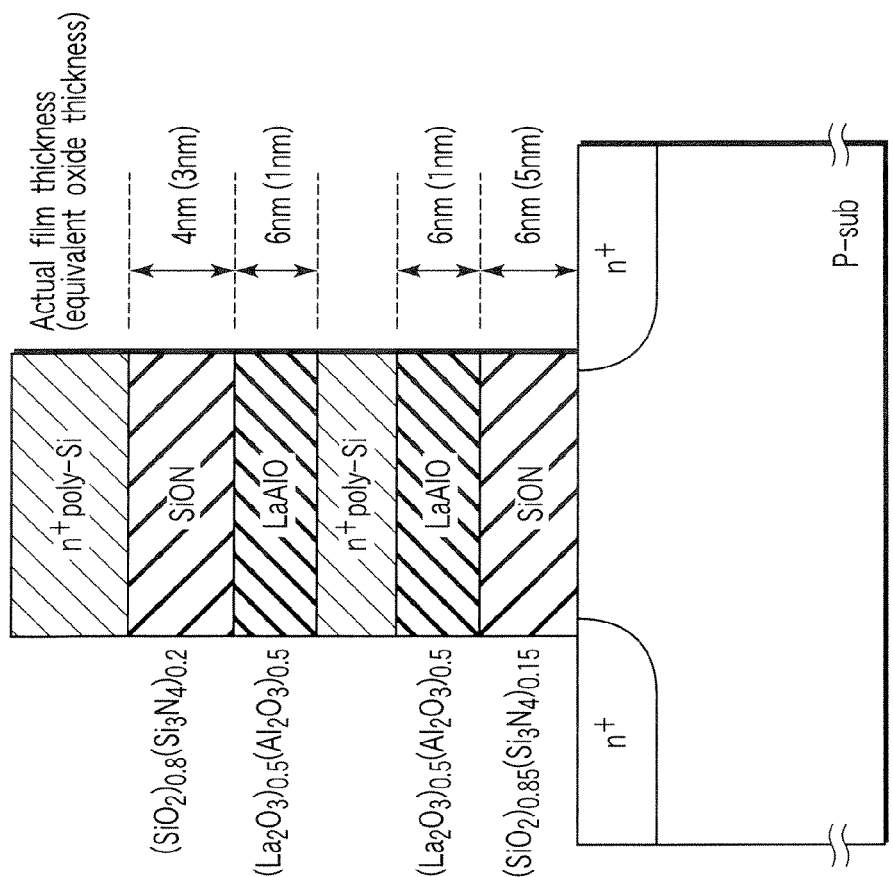
FIG. 12 is a cross-sectional view showing a cell structure according to a second embodiment.

FIG. 12 shows the structure of a memory cell according to a second embodiment.

A two-layered insulating film is formed on the p-type silicon substrate (p-sub) as the tunnel insulating film. A silicon oxynitride film (SiON) is formed on the silicon substrate in contact with the channel region thereof. Lanthanum aluminate (LaAlO) is formed on the silicon oxynitride film as an insulating material including the metal element having the d-orbital.

Polycrystalline silicon ($n^+$ poly-Si) including n-type dopant impurity (phosphorus) is formed on the two-layered tunnel insulating film as the floating gate electrode. A two-layered insulating film is formed on the polycrystalline silicon as the IPD insulating film. Lanthanum aluminate (LaAlO) is formed on the floating gate electrode in contact therewith as the insulating material including the metal element having the d-orbital.

A silicon oxynitride film (SiON) is formed on the lanthanum aluminate. Polycrystalline silicon ($n^+$ poly-Si) including the n-type dopant impurity (phosphorus) is formed on the silicon oxynitride film as the control gate electrode.

Of the tunnel insulating film, when the composition of the SiON is, for example, $(SiO_2)_{0.85}(Si_3N_4)_{0.15}$, the film thickness is set at about 6 nm, and when the composition of the LaAlO is, for example, $(La_2O_3)_{0.5}(Al_2O_3)_{0.5}$, the film thickness is set at about 6 nm. Of the IPD film, when the composition of the LaAlO is, for example, $(La_2O_3)_{0.5}(Al_2O_3)_{0.5}$, the film thickness is set at about 6 nm similarly and when the composition of the silicon oxynitride film on the above is, for example, $(SiO_2)_{0.8}(Si_3N_4)_{0.2}$, the film thickness is set at about 4 nm.

The thickness of the $n^+$ type polycrystalline silicon each serving as the floating gate electrode and the control gate electrode is set at a value in the range of about 30 to 60 nm.

In this embodiment, the lanthanum aluminate is used as the insulating material including the metal element having the d-orbital because it has a high dielectric constant and a high barrier height. The $La_2O_3$ itself is hygroscopic, but by making the compound ratio of the La:Al at 1:1 as $(La_2O_3)_{0.5}(Al_2O_3)_{0.5}$, a stable perovskite-typed structure is realized, which seems to suppress the hygroscopicity.

As the compound of the lanthanum aluminate, a mixture with much more $Al_2O_3$ is preferable other than the above stable structure. A preferable leakage current characteristic, material processability, and hygroscopic suppressive effect can be obtained by fixing the compound ratio of the lanthanum aluminate in the range of $(La_2O_3)_{0.2}(Al_2O_3)_{0.8}$ to $(La_2O_3)_{0.5}(Al_2O_3)_{0.5}$ or to $(La_2O_3)_{0.6}(Al_2O_3)_{0.4}$.

Although the formation of an interfacial layer is often suppressed in the case of using the lanthanum aluminate, ultra-thin interfacial layers may exist respectively in the interface between the tunnel insulating film and the floating gate electrode and the interface between the IPD film and the floating gate electrode, in this stacked gate structure.

In the case of this structure, since the equivalent oxide thickness of the tunnel insulating film is 6 nm and the equivalent oxide thickness of the IPD film is 4 nm, the height of the floating gate electrode 103 can be aligned to the height of the isolation oxide film 106, in FIG. 6, to realize a so-called flat memory cell structure.

Basically, the process which has been described in the reference (FIGS. 1 to 6) can be applied to the method of manufacturing the memory cell in FIG. 12, without any modification.

Hereafter, only the steps different from those of the reference will be described.

The oxynitride film of the tunnel insulating film is formed by the plasma nitridation after the silicon oxide film is formed as a base. Then, the lanthanum aluminate is formed by the sputtering method in order to get, for example, $(La_2O_3)_{0.5}(Al_2O_3)_{0.5}$. Then, it is annealed in the $O_2$ ambient at a temperature of about 700° C. and a pressure of about 130 Pa.

The lanthanum aluminate of the IPD film can be formed in the same way as the hafnium aluminate of the tunnel insulating film. Then, the $SiO_2$ film is formed by the plasma CVD method with $SiH_4$ and $N_2O$ and nitrogen is introduced into the $SiO_2$ film by the plasma nitridation.

The manufacturing method shown here is only one example and another manufacturing method may be used in order to form the memory cell of FIG. 12.

Alternatively, it is possible to form the high-k insulating films and the SiON films included in the tunnel insulating film and the IPD film, according to the ALD, vapor deposition, laser ablation, MBE method, or a method of these combination, other than the sputtering and CVD methods.

For example, the lanthanum aluminate is formed into a film by the CVD method described in, for example, the document: A.-D. Li, Q.-Y. Shao, H.-Q. Ling, J.-B. Cheng, D Wu, Z.-G. Liu, N.-B. Ming, C Wang, H.-W. Zhou, and B.-Y. Nguyen, "Characteristics of $LaAlO_3$ gate dielectrics on Si grown by metalorganic chemical vapor deposition," Appl. Phys. Lett. 83, 3540 (2003), instead of the sputtering method.

Oxide, oxynitride, or oxysilicide including at least one element or more of Hf, La, Y. Ce, Ti, and Zr, or their mixture, other than LaAlO, may be used as the insulating material, of the tunnel insulating film and the IPD film, including the metal element having the d-orbital, and further a stack layer may be formed by the above material.

Interfacial layers made from the ultra-thin insulating material may be interposed respectively in the interface between the IPD film and the floating gate electrode and the interface between the tunnel insulating film and the floating gate electrode.

(3) Third Embodiment

Figures 13, 14:
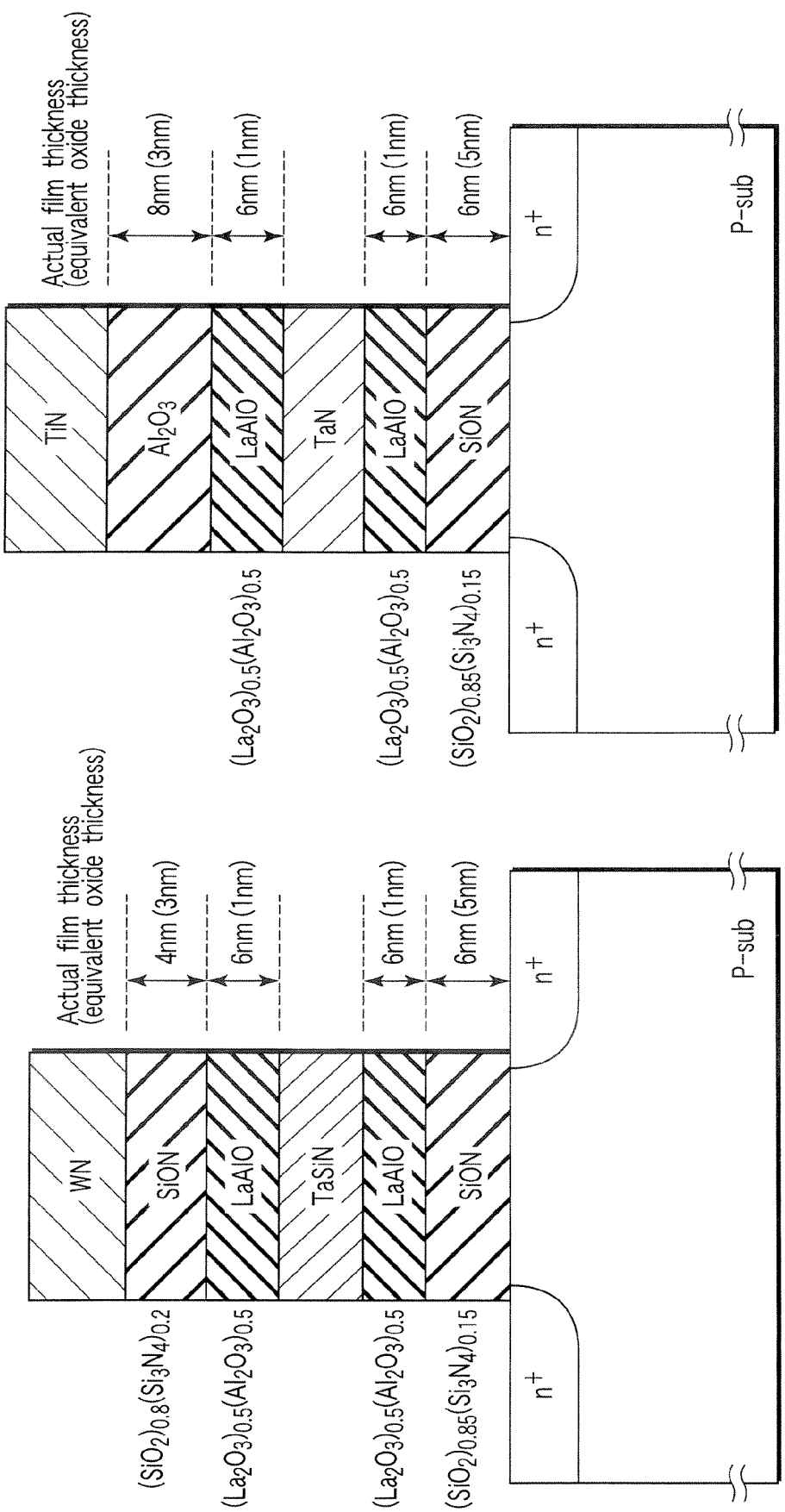
FIG. 13 is a cross-sectional view showing a cell structure according to a third embodiment.
FIG. 14 is a cross-sectional view showing a cell structure according to a fourth embodiment.

FIG. 13 shows the structure of a memory cell according to a third embodiment.

The third embodiment relates to a structure in which the floating gate electrode and the control gate electrode in the second embodiment are replaced with the metallic material.

A two-layered insulating film is formed on the p-type silicon substrate as the tunnel insulating film. A silicon oxynitride film (SiON) is formed on the silicon substrate in contact with the channel region thereof. Lanthanum aluminate (LaAlO) is formed on the silicon oxynitride film as an insulating material including the metal element having the d-orbital.

Tantalum silicide nitride (TaSiN) is formed on the two-layered tunnel insulating film as the floating gate electrode. A two-layered insulating film is formed on the TaSiN as the IPD film. The lanthanum aluminate (LaAlO) is formed on the floating gate electrode in contact therewith, as the insulating material including the metal element having the d-orbital.

A silicon oxynitride film (SiON) is formed on the lanthanum aluminate. Tungsten nitride (WN) is formed on the silicon oxynitride film as the control gate electrode. Of the tunnel insulating film, when the composition of the SiON is, for example, $(SiO_2)_{0.85}(Si_3N_4)_{0.15}$, the film thickness is set at about 6 nm, and when the composition of the LaAlO is, for example, $(La_2O_3)_{0.5}(Al_2O_3)_{0.5}$, the film thickness is set at about 6 nm. Of the IPD film, when the composition of the LaAlO is, for example, $(La_2O_3)_{0.5}(Al_2O_3)_{0.5}$, the film thickness is set at about 6 nm similarly and when the composition of the silicon oxynitride film on the above is, for example, $(SiO_2)_{0.8}(Si_3N_4)_{0.2}$, the film thickness is set at about 4 nm.

The thickness of TaSiN serving as the floating gate electrode and the thickness of WN serving as the control gate electrode are respectively set at a value in the range of about 30 to 60 nm.

Ultra-thin interfacial layers may exist respectively in the interface between the tunnel insulating film and the floating gate electrode and the interface between the IPD film and the floating gate electrode.

In the case of this structure, since the equivalent oxide thickness of the tunnel insulating film is 6 nm and the equivalent oxide thickness of the IPD film is 4 nm, the height of the floating gate electrode 103 can be aligned to the height of the isolation oxide film 106, in FIG. 6, to realize a so-called flat memory cell structure.

Basically, the process which has been described in the reference (FIGS. 1 to 6) can be applied to the method of manufacturing the memory cell in FIG. 13, without any modification.

Hereafter, only the steps different from those of the reference will be described.

The oxynitride film of the tunnel insulating film is formed by the plasma nitridation after the silicon oxide film is formed as a base. Then, the lanthanum aluminate is formed by the sputtering method in order to get, for example, $(La_2O_3)_{0.5}(Al_2O_3)_{0.5}$. Then, it is annealed in the $O_2$ ambient at a temperature of about 700° C. and a pressure of about 130 Pa.

Next, TaSiN serving as the floating gate electrode is formed by the ALD method with the source gas of $Ta[N(CH_3)_2]_5$, $NH_3$ and $SiH_4$.

The lanthanum aluminate of the IPD film can be formed in the same way as the lanthanum aluminate of the tunnel insulating film. The SiON film as the upper layer of the IPD film is formed by forming the $SiO_2$ film according to the plasma CVD method with $SiH_4$ and $N_2O$ and introducing nitrogen into the $SiO_2$ film by the plasma nitridation.

At last, the WN of the control gate electrode is formed by the ALD method with the source gas of $WF_6$ and $NH_3$.

The manufacturing method shown here is only one example and another manufacturing method may be used in order to form the memory cell of FIG. 13.

Alternatively, it is possible to form the high-k insulating films and the SiON films included in the tunnel insulating film and the IPD film, and further the floating gate electrode and the control gate electrode, according to the CVD, vapor deposition, laser ablation, MBE method, or a method of these combination, other than the ALD and sputtering methods.

Although the lanthanum aluminate is used as the high dielectric constant insulating material including the metal element having the d-orbital in this embodiment, oxide, oxynitride, or oxysilicide including at least one element or more selected from the group consisting of Hf, La, Y, Ce, Ti, and Zr, or their mixture or stack layer, other than LaAlO, may be used as the high dielectric constant insulating layer of the tunnel insulating film and the IPD film.

Interfacial layers made from the ultra-thin insulating material may exist respectively in the interface between the IPD film and the floating gate electrode and the interface between the tunnel insulating film and the floating gate electrode.

Although in this embodiment, the floating gate electrode is formed by the TaSiN, it may be formed by the metal gate material for n-channel MIS transistor, such as TaN, TiN, W, and WSi or by the metal conductive material having the work function near the center of the Si forbidden band. As the floating gate electrode, silicide such as Co and Ni may be used.

Although the WN is used as the material of the control gate electrode, the metal gate material for p-channel MIS transistor such as Ru and TaC or an element such as Au, Pt, Co, Ni, Pd, Te, Mo, Ir, Hf, Zr, Y, La, Ti, W, and the like or chemical compound (including silicide and nitride) may be used.

Especially, the material having the larger work function than that of the central portion of the Si forbidden band is preferably used as the control gate electrode.

(4) Fourth Embodiment

FIG. 14 shows the structure of a memory cell according to a fourth embodiment.

The fourth embodiment relates to a structure in which the floating gate electrode and the control gate electrode in the third embodiment are replaced with another metallic material and aluminum oxide ($Al_2O_3$) is used in the upper layer of the IPD film as a detrapping preventive film, instead of the SiON layer.

A two-layered insulating film is formed on the p-type silicon substrate as the tunnel insulating film. A silicon oxynitride film (SiON) is formed on the silicon substrate in contact with the channel region thereof. Lanthanum aluminate (LaAlO) is formed on the silicon oxynitride film as an insulating material including the metal element having the d-orbital.

Tungsten nitride (TaN) is formed on the two-layered tunnel insulating film as the floating gate electrode. A two-layered insulating film is formed on the TaN as the IPD film. Lanthanum aluminate (LaAlO) is formed on the floating gate electrode in contact therewith, as the insulating material including the metal element having the d-orbital.

Aluminum oxide ($Al_2O_3$) is formed on the lanthanum aluminate. Titanium nitride (TiN) is formed on the aluminum oxide as the control gate electrode.

Of the tunnel insulating film, when the composition of the SiON is, for example, $(SiO_2)_{0.85}(Si_3N_4)_{0.15}$, the film thickness is set at about 6 nm, and when the composition of the LaAlO is, for example, $(La_2O_3)_{0.5}(Al_2O_3)_{0.5}$, the film thickness is set at about 6 nm. Of the IPD film, when the composition of the LaAlO is $(La_2O_3)_{0.5}(Al_2O_3)_{0.5}$ similarly, the film thickness is set at about 6 nm and the film thickness of the aluminum oxide film on the above is set at about 8 nm.

The thickness of the TaN as the floating gate electrode and the thickness of the TiN as the control gate electrode are respectively set at a value in the range of about 30 to 60 nm.

Ultra-thin interfacial layers may exist respectively in the interface between the tunnel insulating film and the floating gate electrode and the interface between the IPD film and the floating gate electrode.

In the case of this structure, since the equivalent oxide thickness of the tunnel insulating film is 6 nm and the equivalent oxide thickness of the IPD film is 4 nm, the height of the floating gate electrode 103 can be aligned to the height of the isolation oxide film 106, in FIG. 6, to realize a so-called flat memory cell structure.

Basically, the process which has been described in the reference (FIGS. 1 to 6) can be applied to the method of manufacturing the memory cell in FIG. 14, without any modification.

Hereafter, only the steps different from those of the reference will be described.

The oxynitride film of the tunnel insulating film is formed by the plasma nitridation after the silicon oxide film is formed as a base. Then, the lanthanum aluminate is formed by the sputtering method in order to get, for example, $(La_2O_3)_{0.5}(Al_2O_3)_{0.5}$. Then, it is annealed in the $O_2$ ambient at a temperature of about 700° C. and a pressure of about 130 Pa.

Next, the TaN serving as the floating gate electrode is formed by the ALD method with the source gas of Ta $[N(CH_3)_2]_5$ and $NH_3$.

The lanthanum aluminate of the IPD film can be formed in the same way as the lanthanum aluminate of the tunnel insulating film. The upper $Al_2O_3$ layer of the IPD film is formed in the atmosphere at a temperature of about 250° C. according to the ALD method with the source gas of $Al(CH_3)_3$ and $H_2O$. Then, it is annealed in the $O_2$ ambient at a temperature of about 850° C. at a pressure of about 130 Pa.

At last, the TiN of the control gate electrode is formed by the CVD method with the source gas of $TiCl_4$ and $NH_3$ at a temperature of about 450° C.

The manufacturing method shown here is only one example and another manufacturing method may be used in order to form the memory cell of FIG. 14.

Alternatively, it is possible to form the high-k insulating film and the $Al_2O_3$ film included in the tunnel insulating film and the IPD film, according to the vapor deposition, laser ablation, MBE method, or a method of these combination, other than the ALD, CVD, and sputtering methods.

Although the lanthanum aluminate is used as the high dielectric constant insulating material including the metal element having the d-orbital in this embodiment, oxide, oxynitride, oxysilicide (silicate), or aluminate including at least one element or more selected from the group consisting of Hf, La, Y, Ce, Ti, and Zr, or their mixture or stack layer, other than LaAlO, may be used as the insulating layer of the high dielectric constant for the tunnel insulating film and the IPD film.

Although the floating gate electrode is formed by the TaN in this embodiment, it may be formed by the metal gate material for n-channel MIS transistor, such as TaSiN, TiN, W, and WSi or the metal conductive material having the work function near the center of the Si forbidden band. As the floating gate electrode, silicide such as Co and Ni may be used.

Although the TiN is used as the material of the control gate electrode, the metal gate material for p-channel MIS transistor such as WN, Ru, and TaC or an element such as Au, Pt, Co, Ni, Pd, Te, Mo, Ir, Hf, Zr, Y, La, W, Ti, and the like or chemical compound (including silicide and nitride) may be used. Alternatively, since the TaN is known as the material presenting a high stability with respect to the $Al_2O_3$ used as the upper layer of the IPD film, it may be used as the material of the control gate electrode.

(5) Fifth Embodiment

FIG. 15 shows the structure of a memory cell according to a fifth embodiment.

The fifth embodiment relates to a structure in which the metallic material is used for the floating gate electrode and the control gate electrode and the different materials are used for the layer on the floating gate electrode and the layer under the same electrode as the high dielectric constant insulating material including the metal element having the d-orbital.

A two-layered insulating film is formed on the p-type silicon substrate as the tunnel insulating film. A silicon oxynitride film (SION) is formed on the silicon substrate in contact with the channel region thereof. Hafnium aluminate (HfAlO) is formed on the silicon oxynitride film as a high dielectric constant insulating material including the metal element having the d-orbital.

TaSiN is formed on the two-layered tunnel insulating film as the floating gate electrode. A two-layered insulating film is formed on the TaSiN as the IPD film. In contact with the floating gate electrode, lanthanum aluminate (LaAlO) is formed as the high dielectric constant insulating material including the metal element having the d-orbital.

Aluminum oxide ($Al_2O_3$) is formed on the lanthanum aluminate. Tungsten nitride (WN) is formed on the aluminum oxide as the control gate electrode.

Of the tunnel insulating film, when the composition of the SiON is, for example, $(SiO_2)_{0.85}(Si_3N_4)_{0.15}$, the film thickness is set at about 6 nm, and when the composition of the HfAlO is, for example, $(HfO_2)_{0.75}(Al_2O_3)_{0.25}$, the film thickness is set at about 5 nm. Of the IPD film, when the composition of the LaAlO is $(La_2O_3)_{0.5}(Al_2O_3)_{0.5}$, the film thickness is set at about 6 nm and the film thickness of the $Al_2O_3$ film on the above is set at, for example, about 8 nm.

The thickness of the TaSiN as the floating gate electrode and the thickness of the WN as the control gate electrode are respectively set at a value in the range of about 30 to 60 nm.

Ultra-thin interfacial layers may exist respectively in the interface between the tunnel insulating film and the floating gate electrode and the interface between the IPD film and the floating gate electrode.

In the case of this structure, since the equivalent oxide thickness of the tunnel insulating film is 6 nm and the equivalent oxide thickness of the IPD film is 4 nm, the height of the floating gate electrode 103 can be aligned to the height of the isolation oxide film 106, in FIG. 6, to realize a so-called flat memory cell structure.

Basically, the process which has been described in the reference (FIGS. 1 to 6) can be applied to the method of manufacturing the memory cell in FIG. 15, without any modification.

Hereafter, only the steps different from those of the reference will be described.

The oxynitride film of the tunnel insulating film is formed by the plasma nitridation after the silicon oxide film is formed as a base. The hafnium aluminate (HfAlO) is formed by the ALD method with the source gas of, for example, $Al(CH_3)_3$, $Hf[N(CH_3)_2]_4$, and $H_2O$ in the atmosphere at a temperature of about 250° C. Then, it is annealed in the $O_2$ ambient at a temperature of about 850° C. and a pressure of about 130 Pa.

Next, the TaSiN serving as the floating gate is formed by the ALD method with the source gas of Ta[N(CH$_3$)$_2$]$_5$, NH$_3$, and SiH$_4$.

The lanthanum aluminate of the IPD film is formed by the sputtering method in order to get (La$_2$O$_3$)$_{0.5}$(Al$_2$O$_3$)$_{0.5}$. Then, it is annealed in the O$_2$ ambient at a temperature of about 700° C. and a pressure of about 130 Pa. The upper Al$_2$O$_3$ layer of the IPD film is formed in the atmosphere at a temperature of about 250° C. according to the ALD method with the source gas of Al(CH$_3$)$_3$ and H$_2$O. Continuously, it is annealed in the O$_2$ ambient at a temperature of about 850° C. and a pressure of about 130 Pa.

At last, the WN of the control gate electrode is formed by the CVD method at a temperature of about 450° C. with the source gas of W(CO)$_6$ and NH$_3$.

The manufacturing method shown here is only one example and another manufacturing method may be used in order to form the memory cell of FIG. 15.

Alternatively, it is possible to form the high dielectric constant insulating film and the Al$_2$O$_3$ film included in the tunnel insulating film and the IPD film, according to the vapor deposition, laser ablation, MBE method, or a method of these combination, other than the ALD, CVD, and sputtering methods.

The high dielectric constant insulating material including the metal element having the d-orbital, of the tunnel insulating film and the IPD film, includes oxide, oxynitride, oxysilicide, or aluminate including at least one element selected from the group consisting of Hf, La, Y, Ce, Ti, and Zr, or their mixture or stack layer.

Although the floating gate electrode is formed by the TaSiN in this embodiment, it may be formed by the metal gate material for n-channel MIS transistor, such as TaN, TiN, W, and WSi or the metal conductive material having the work function near the center of the Si forbidden band. As the floating gate electrode, silicide such as Co and Ni may be used.

Although the WN is used as the material of the control gate electrode, the metal gate material for p-channel MIS transistor such as Ru and TaC or an element such as Au, Pt, Co, Ni, Pd, Te, Mo, Ir, Hf, Zr, Y, La, Ti, W, and the like or chemical compound (including silicide and nitride) may be used.

Especially, the control gate electrode is preferably formed by the material having the larger work function than that of the central portion of the Si forbidden band. Since the TaN is known as the material presenting a higher stability when coming into contact with the Al$_2$O$_3$, it may be used as the material of the control gate electrode.

(6) Sixth Embodiment

FIG. 16 shows the structure of a memory cell according to a sixth embodiment.

The sixth embodiment relates to a structure in which the floating gate electrode is formed by a two-layered conductive material. This embodiment proposes a structure in which the different materials are used in the upper and lower portions of the floating gate electrode as the high dielectric constant insulating material including the metal element having the d-orbital and HfTiO is used in the IPD film.

A two-layered insulating film is formed on the p-type silicon substrate as the tunnel insulating film. A silicon oxynitride film (SiON) is formed on the silicon substrate in contact with the channel region thereof. Lanthanum aluminate (LaAlO) is formed on the silicon oxynitride film as a high dielectric constant insulating material including the metal element having the d-orbital.

A two-layered conductive layer is formed on this tunnel insulating film as the floating gate electrode. Namely, tantalum silicate nitride (TaSiN) is formed in the floating gate electrode as its lower layer and tungsten nitride (WN) is formed in the same electrode as its upper layer. A two-layered insulating film is formed on the floating gate electrode as the IPD film. HfTiO is formed on the floating gate electrode in contact therewith as the high dielectric constant insulating material including the metal having the d-orbital.

Aluminum oxide (Al$_2$O$_3$) is formed on the HfTiO. Tungsten nitride (WN) is formed on the Al$_2$O$_3$ as the control gate electrode.

Of the tunnel insulating film, when the composition of the SiON is, for example, (SiO$_2$)$_{0.85}$(Si$_3$N$_4$)$_{0.15}$, the film thickness is set at about 6 nm, and when the composition of the LaAlO is, for example, (La$_2$O$_3$)$_{0.5}$(Al$_2$O$_3$)$_{0.5}$, the film thickness is set at about 6 nm. Of the IPD film, when the composition of the HfTiO is, for example, (HfO$_2$)$_{0.3}$(TiO$_2$)$_{0.7}$, the film thickness is set at about 8 nm and the film thickness of the aluminum oxide (Al$_2$O$_3$) on the above is set at about 8 nm. The thickness of the TaSiN/WN stack layer as the floating gate electrode and the thickness of the WN as the control gate electrode are respectively set at a value in the range of about 30 to 60 nm.

Ultra-thin interfacial layers made of a insulating material may exist respectively in the interface between the tunnel insulating film and the floating gate electrode and the interface between the IPD film and the floating gate electrode.

In the case of this structure, since the equivalent oxide thickness of the tunnel insulating film is 6 nm and the equivalent oxide thickness of the IPD film is 4 nm, the height of the floating gate electrode 103 can be aligned to the height of the isolation oxide film 106, in FIG. 6, to realize a so-called flat memory cell structure.

Basically, the process which has been described in the reference (FIGS. 1 to 6) can be applied to the method of manufacturing the memory cell in FIG. 16, without any modification.

Hereafter, only the steps different from those of the reference will be described.

The oxynitride film of the tunnel insulating film is formed by the plasma nitridation after the silicon oxide film is formed as a base. Then, the lanthanum aluminate is formed by the sputtering method in order to get, for example, (La$_2$O$_3$)$_{0.5}$(Al$_2$O$_3$)$_{0.5}$. Then, it is annealed in the O$_2$ ambient at a temperature of about 700° C. and a pressure of about 130 Pa.

Next, the TaSiN serving as the lower layer of the floating gate electrode is formed by the ALD method with the source gas of Ta[N(CH$_3$)$_2$]$_5$, NH$_3$, and SiH$_4$. Continuously, the upper WN layer of the floating gate electrode is formed by the ALD method with the source gas of WF$_6$ and NH$_3$.

The HfTiO of the IPD film is formed by the sputtering method in order to get (HfO$_2$)$_{0.3}$(TiO$_2$)$_{0.7}$. Then, it is annealed in the O$_2$ ambient at a temperature of about 700° C. and a pressure of about 130 Pa. Continuously, the upper Al$_2$O$_3$ layer of the IPD film is formed in the atmosphere at a temperature of 250° C. by the ALD method with the source gas of Al(CH$_3$)$_3$ and H$_2$O. Then, it is annealed in the O$_2$ ambient at a temperature of about 850° C. and a pressure of about 130 Pa.

At last, the WN of the control gate electrode is formed by the ALD method with the source gas of WF$_6$ and NH$_3$, similarly to the lower layer of the floating gate electrode.

The manufacturing method shown here is only one example and another manufacturing method may be used in order to form the memory cell of FIG. 16.

Alternatively, it is possible to form the tunnel insulating film, the IPD film, the floating gate electrode, and the control gate electrode, according to the CVD, vapor deposition, laser ablation, MBE method, or a method of their combination, other than the ALD and sputtering methods.

Although the LaAlO and the HfTiO are used as the high dielectric constant insulating material including the metal element having the d-orbital in this embodiment, the high dielectric constant material layer including the metal element having the d-orbital, of the tunnel insulating film and the IPD film, may include oxide, oxynitride, oxysilicide, aluminate, or aluminate nitride including at least one element selected from the group consisting of Hf, La, Y, Ce, Ti, and Zr, or their mixture or stack layer.

For example, the material presenting a high dielectric constant such as the LaTiO and the HfTaO may be used instead of LaAlO and HfTiO.

Although the floating gate electrode is formed by a stack film consisting of the TaSiN and the WN in this embodiment, it may be formed by the metal gate material for n-channel MIS transistor, such as TiN, W, and WSi or a single layer or a stack layer of the metallic conductive material having the work function near the center of the Si forbidden band. As the floating gate electrode, silicide such as Co and Ni may be used.

Although the WN is used as the material of the control gate electrode, the metal gate material for p-channel MIS transistor such as Ru and TaC or an element such as Au, Pt, Co, Ni, Pd, Te, Me, Ir, Hf, Zr, Y, La, Ti, W, and the like or chemical compound (including silicide and nitride) may be used.

Especially, the control gate electrode is preferably formed by the material having the larger work function than that of the central portion of the Si forbidden band. Since the TaN is known as the material presenting a higher stability when coming into contact with the $Al_2O_3$, it may be used as the material of the control gate electrode.

(7) Seventh Embodiment

FIG. 17 shows the structure of a memory cell according to a seventh embodiment.

The seventh embodiment relates to a structure in which SiON layers are interposed respectively between the floating gate electrode and the tunnel insulating film and between the floating gate electrode and the IPD film, as a controlled interfacial layer.

The following three layers are formed on the p-type silicon substrate as the tunnel insulating film. A silicon oxynitride film (SiON) is formed on the silicon substrate in contact with the channel region thereof. Hafnia ($HfO_2$) is formed on the silicon oxynitride film as a high dielectric constant insulating material including the metal element having the d-orbital. An ultra-thin interfacial layer is formed on the above with the silicon oxynitride film (SiON) as a reaction preventive layer.

Polycrystalline silicon including the n-typed dopant impurity (phosphorus) is formed on the above three-layered tunnel insulating film as the floating gate electrode.

The following three layers are formed on the polycrystalline silicon, as the IPD insulating film. First, a silicon oxynitride film (SiON) is formed as an interfacial layer in contact with the floating gate electrode. Hafnia ($HfO_2$) is formed on the silicon oxynitride film, as the high dielectric constant insulating material including the metal element having the d-orbital. A silicon oxynitride film (SiON) serving as a charge detrapping preventive film is formed on the hafnia.

Polycrystalline silicon including the n-typed dopant impurity (phosphorus) is formed on the SiON as the control gate electrode.

Of the tunnel insulating film, the composition of the SiON in contact with the channel is, for example, $(SiO_2)_{0.85}(Si_3N_4)_{0.15}$, the film thickness is set at about 6 nm. At this time, the equivalent oxide thickness of the SiON becomes about 5 nm. The film thickness of the $HfO_2$ on the above is set at about 7.2 nm. At this time, the equivalent oxide thickness of the $HfO_2$ becomes about 1.2 nm.

When the composition of the SiON interfacial layer on the above is, for example, $(SiO_2)_{0.6}(Si_3N_4)_{0.4}$, the film thickness is set at about 0.6 nm. At this time, the equivalent oxide thickness of the SiON interfacial layer becomes about 0.4 nm.

Of the IPD film, when the composition of the SiON interfacial layer in contact with the floating gate electrode is, for example, $(SiO_2)_{0.6}(Si_3N_4)_{0.4}$, the film thickness is set at about 0.6 nm. At this time, the equivalent oxide thickness of the SiON interfacial layer becomes about 0.4 nm.

The film thickness of the $HfO_2$ layer on the above is set at about 6 nm. At this time, the equivalent oxide thickness of the $HfO_2$ becomes about 1 nm. When the composition of the SiON layer on the above is, for example, $(SiO_2)_{0.8}(Si_3N_4)_{0.2}$, the film thickness is set at about 4 nm. At this time, the equivalent oxide thickness of the SiON becomes about 3 nm.

The thickness of the $n^+$ type polycrystalline silicon each serving as the floating gate electrode and the control gate electrode is set at a value in the range of about 30 to 60 nm.

In the case of this structure, since the equivalent oxide thickness of the tunnel insulating film is 6 nm and the equivalent oxide thickness of the IPD film is 4 nm, the height of the floating gate electrode 103 can be aligned to the height of the isolation oxide film 106, in FIG. 6, to realize a so-called flat memory cell structure and make the coupling ratio 0.6.

Basically, the process which has been described in the reference (FIGS. 1 to 6) can be applied to the method of manufacturing the memory cell in FIG. 17, without any modification.

Hereafter, only the steps different from those of the reference will be described.

The silicon oxynitride film as the tunnel insulating film is formed by the plasma nitridation after a silicon thermal oxide film is formed as a base. The hafnia ($HfO_2$) is formed in the atmosphere at a temperature of about 250° C. by the ALD method with the source gas of $Hf[N(CH_3)_2]_4$ and $H_2O$. Then, it is annealed in the $O_2$ ambient at a temperature of about 850° C. and a pressure of about 130 Pa. The ultra-thin silicon oxynitride film is formed by the ALD method with $SiH_4$, $NH_3$, and $H_2O$.

As the IPD film, after deposition of $n^+$ poly-Si, after the ultra-thin silicon oxynitride film is formed by the ALD method with the source gas of $SiH_4$, $NH_3$, and $H_2O$, the hafnia ($HfO_2$) is formed in the atmosphere at a temperature of about 250° C. by the ALD method with the source gas of $Hf[N(CH_3)_2]_4$ and $H_2O$. Then, the $SiO_2$ is formed by the plasma CVD method with $SiH_4$ and $N_2O$ and the SiON layer is formed by the plasma nitridation as the upper layer of the IPD film.

The manufacturing method shown here is only one example and another manufacturing method may be used in order to form the memory cell of FIG. 17.

For example, the source gas used in the ALD method may be replaced by another gas, and the $SiO_2$ deposition in the process of forming the SiON in the IPD film may be performed by the thermal CVD method using TEOS-$O_2$, instead of the plasma CVD method.

Alternatively, it is possible to form the insulating film layers included in the tunnel insulating film and the IPD film, according to the sputtering, vapor deposition, laser ablation, and MBE method, or a method of these combination, other than the ALD and CVD methods.

(8) Eighth Embodiment

FIG. 18 shows the structure of a memory cell according to an eighth embodiment.

The eighth embodiment relates to a structure in which $Al_2O_3$ layers are interposed respectively between the floating gate electrode and the tunnel insulating film and between the floating gate electrode and the IPD film, as a controlled interfacial layer.

The following three layers are formed on the p-type silicon substrate as the tunnel insulating film. A silicon oxynitride film (SiON) is formed on the silicon substrate in contact with the channel region thereof. Lanthanum aluminate (LaAlO) is formed on the silicon oxynitride film as a high dielectric constant insulating material including the metal element having the d-orbital. An ultra-thin interfacial layer of alumina ($Al_2O_3$) is formed thereon.

Tantalum nitride (TaN) is formed on the three-layered tunnel insulating film as the floating gate electrode. The following three layers are formed on the floating gate electrode as the IPD insulating film.

First, alumina ($Al_2O_3$) serving as an interfacial layer is formed on the floating gate electrode in contact therewith. Lanthanum aluminate (LaAlO) is formed on the $Al_2O_3$, as the high dielectric constant insulating material including the metal element having the d-orbital. An alumina film ($Al_2O_3$) serving as a charge detrapping preventive film, is formed on the lanthanum aluminate.

Titanium nitride (TiN) is formed on the alumina as the control gate electrode.

Of the tunnel insulating film, when the compound of the SiON in contact with the channel is, for example, $(SiO_2)_{0.85}(Si_3N_4)_{0.15}$, the film thickness is set at about 6 nm. At this time, the equivalent oxide thickness of the SiON becomes about 5 nm. The thickness of the LaAlO on the above is set at about 7.2 nm. At this time, the equivalent oxide thickness of the LaAlO becomes about 1.2 nm.

The film thickness of the $Al_2O_3$ interfacial layer on the above is set at about 1.1 nm. At this time, the equivalent oxide thickness of the $Al_2O_3$ interfacial layer becomes about 0.4 nm.

Of the IPD film, the $Al_2O_3$ interfacial layer in contact with the floating gate electrode is set at about 1.1 nm. At this time, the equivalent oxide thickness of the $Al_2O_3$ interfacial layer becomes about 0.4 nm. The film thickness of the LaAlO layer on the above is set at about 6 nm. At this time, the equivalent oxide thickness of the LaAlO layer becomes about 1 nm.

The film thickness of the $Al_2O_3$ layer on the above is set at about 8 nm. At this time, the equivalent oxide thickness of the $Al_2O_3$ layer becomes about 3 nm. Each thickness of the TaN as the floating gate electrode and the TiN as the control gate electrode is set at a value, for example, in the range of about 30 to 60 nm.

In the case of this structure, since the equivalent oxide thickness of the tunnel insulating film is 6 nm and the equivalent oxide thickness of the IPD film is 4 nm, the height of the floating gate electrode 103 can be aligned to the height of the isolation oxide film 106, in FIG. 6, to realize a so-called flat memory cell structure and make the coupling ratio 0.6.

Basically, the process which has been described in the reference (FIGS. 1 to 6) can be applied to the method of manufacturing the memory cell in FIG. 18, without any modification.

Hereafter, only the steps different from those of the reference will be described.

The silicon oxynitride film as the tunnel insulating film is formed by the plasma nitridation after the silicon thermal oxide film is formed as a base. Next, the lanthanum aluminate is formed by the sputtering method in order to get, for example, $(La_2O_3)_{0.5}(Al_2O_3)_{0.5}$. Then, it is annealed in the $O_2$ ambient at a temperature of about 700° C. and a pressure of about 130 Pa. Then, the upper $Al_2O_3$ interfacial layer is formed in the atmosphere at a temperature of about 250° C. by using the ALD method with the source gas of $Al(CH_3)_3$ and $H_2O$.

After the TaN is formed as the floating gate electrode by the CVD method with $Ta[N(C_2H_5)_2]_5$ and $NH_3$, the IPD film is formed as follows.

First, the interfacial $Al_2O_3$ layer is formed in the atmosphere at a temperature of about 250° C. by the ALD method with the source gas of $Al(CH_3)_3$ and $H_2O$. Next, lanthanum aluminate is formed by the sputtering method in order to get $(La_2O_3)_{0.5}(Al_2O_3)_{0.5}$. Then, it is annealed in the $O_2$ ambient at a temperature of about 700° C. and a pressure of about 130 Pa.

The upper alumina layer ($Al_2O_3$) is formed in the atmosphere of about 250° C. according to the ALD method with the source gas of $Al(CH_3)_3$ and $H_2O$. Then, it is annealed in the $O_2$ ambient at about 850° C. and a pressure of about 130 Pa.

At last, the TiN of the control gate electrode is formed at a temperature of about 450° C. by the CVD method with $TiCl_4$ and $NH_3$.

The manufacturing method shown here is only one example and another manufacturing method may be used in order to form the memory cell of FIG. 18.

For example, the source gas used in the ALD method may be replaced by another gas. The ALD method is compatible with the CVD method, any of which may be used.

Alternatively, it is possible to form the insulating materials included in the tunnel insulating film and the IPD film, according to the sputtering, vapor deposition, laser ablation, and MBE method, or a method of these combination, other than the ALD and CVD methods.

Although the lanthanum aluminate is used as the high dielectric constant (high-k) material in this embodiment, the insulating material including the metal element having the d-orbital, for the tunnel insulating film and the IPD film, may include oxide, oxynitride, oxysilicide, nitride silicate, aluminate, or aluminate nitride, including at least one element selected from the group consisting of Hf, La, Y, Ce, Ti, and Zr, or their mixture or stack layer, other than LaAlO.

Although the floating gate electrode is formed by the TaN in this embodiment, it may be formed by the metal gate material for n-channel MIS transistor, such as TaSiN, TiN, W, and WSi or the metallic conductive material having the work function near the center of the Si forbidden band. As the floating gate electrode, silicide such as Co and Ni may be used.

Although the TiN is used as the material of the control gate electrode, the metal gate material for p-channel MIS transistor such as Ru and TaC or an element such as Au, Pt, Co, Ni, Pd, Te, Mo, Ir, Hf, Zr, Y, La, W, Ti and the like or chemical compound (including silicide and nitride) may be used.

It is preferable that the control gate electrode is formed by the material having the larger work function than that of the central portion of the Si forbidden band.

For example, the WN, instead of the TiN, may be used as the material of the control gate electrode. Alternatively, since the TaN is known as the material presenting a higher stability when coming into contact with the $Al_2O_3$, it may be used as the material of the control gate electrode.

5. Applied Example

The embodiments of the invention are applied to a nonvolatile semiconductor memory device having a memory cell of the stacked gate structure, and particularly to NAND-type flash memory.

The embodiments of the invention may also be applied to the nonvolatile semiconductor memory devices of NOR type, AND type, and DINOR type, a 2-Tr typed flash memory having advantages of each of the NOR type and the NAND type, and further a 3-Tr NAND type having the structure with one memory cell pinched by two selective transistors.

6. Others

According to the embodiments of the invention, even if a memory cell is miniaturized, scaling down of the IPD film in its equivalent oxide thickness can be compatible with a favorable data retention characteristic.

According to the embodiments of the invention, a film of the insulating material (usually, SiO or SION), of the tunnel insulating film, including the metal element having no d-orbital or the semiconductor element, is made thinner than in the conventional technique. However, since the tunnel insulating film is formed in a stack structure with the high-k insulating material and the physical film thickness of the high-k insulating material is thick, it is free from the deterioration of the data retention characteristic caused by an increase of the stress induced leakage current even after a repetition of program/erase cycles.

The invention is not restricted to the above embodiments, but variations of each component can be made without departing from its spirit and scope.

For example, the first and second insulating films may be formed in a multi-layered structure of three or more, instead of the two-layered structure (or three-layered structure including an interfacial layer) as shown in the embodiments of the invention, in the scope of the invention. Alternatively, the material composition may be sequentially varied in each interface portion between these layers and the layers may be sequentially connected to each other.

Especially, the insulating material, of the IPD film, including a metal element having no d-orbital or a semiconductor element, may be formed in a multi-layered structure using a silicon nitride film in its one portion. For example, when it is found that the IPD film does not have enough resistance to dielectric breakdown, a flat cell structure is not used but it may be formed in a memory cell structure with a three dimensional structure in which the floating gate electrodes of adjacent cells face each other. In this case, it can realize such a cell characteristic as relaxing the electric field applied to the IPD film and preventing the dielectric breakdown, by setting the equivalent oxide thickness of the IPD film larger.

Further, the stacked gate structure of the invention is not necessarily formed on the Si substrate. For example, it may be formed in the well regions formed on the Si substrate.

Further, the stacked gate structure of the invention may be formed on a SiGe substrate or a Ge substrate, instead of the Si substrate, or in the well regions formed on these substrates. Further, the stacked gate structure of the invention may be formed on a SOI (silicon on insulator) substrate, a SGOI (silicon-germanium on insulator) substrate, a GOI (germanium on insulator) substrate, in which a thin film semiconductor is formed on the insulating film, or in the wells formed on these substrates.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
    first and second diffusion layers in a semiconductor substrate;
    a first insulating film on a channel which is provided between the first and second diffusion layers;
    a floating gate electrode on the first insulating film, which is formed by a conductive material;
    a second insulating film on the floating gate electrode; and
    a control gate electrode on the second insulating film,
    wherein the first insulating film comprises first and second layers, the first layer is directly in contact with the floating gate electrode and is formed by a first insulating material comprising a metal element having a d orbital, and the second layer is formed by a second insulating material comprising at least one selected from a group of a metal element without the d orbital and a semiconductor element,
    wherein the second insulating film comprises third and fourth layers, the third layer is directly in contact with the floating gate electrode and is formed by a third insulating material comprising a metal element having the d-orbital, and the fourth layer is formed by a fourth insulating material comprising at least one selected from a group of a metal element without the d-orbital and a semiconductor element,
    wherein each of the first and third insulating materials comprises oxide, nitride, oxynitride, silicate, silicate nitride, aluminate, or aluminate nitride comprising at least one element selected from a group of Hf, La, Y, Ce, Ti, and Zr, or their mixture or stack layer,
    wherein the first and third insulating materials are the same, and
    wherein each of the second and fourth insulating materials comprises oxide, nitride, or oxynitride comprising at least one element selected from a group of Al and Si, or their mixture or stack layer.

2. The device according to claim 1, wherein
    the floating gate electrode comprises at least one element selected from a group of W, Ti, Ta, Ru, Ni, and Co, its nitride, carbide, silicide, or nitride silicide, or their mixture or stack layer.

3. The device according to claim 1, wherein
    the control gate electrode comprises at least one element selected from a group of W, Ti, Ta, Ru, Ni, and Co, its nitride, carbide, silicide, or nitride silicide, or their mixture or stack layer.

4. The device according to claim 1, wherein
    in the first insulating film, the equivalent oxide thickness of the second layer is larger than that of the first layer, and
    in the second insulating film, the equivalent oxide thickness of the fourth layer is larger than that of the third layer.

5. The device according to claim 1, wherein
the second insulating film comprises one of silicon oxide and silicon oxynitride, with a thickness of 3 nm and more.

6. The device according to claim 1, wherein
each of the first and third layers has a multi-layered structure.

7. The device according to claim 1, wherein the floating gate electrode comprises a polycrystalline silicon including n-type doping impurity.

8. The device according to claim 1, wherein the control gate electrode comprises a polycrystalline silicon including n-type doping impurity.

* * * * *